US 12,461,574 B2
(45) Date of Patent: Nov. 4, 2025

(12) United States Patent
Cho et al.

(10) Patent No.: US 12,461,574 B2
(45) Date of Patent: Nov. 4, 2025

(54) ELECTRONIC DEVICE INCLUDING HEAT DISSIPATION STRUCTURE

(71) Applicant: Samsung Electronics Co., Ltd., Suwon-si (KR)

(72) Inventors: Hyunje Cho, Suwon-si (KR); Jiwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 18/477,024

(22) Filed: Sep. 28, 2023

(65) Prior Publication Data

US 2024/0028092 A1    Jan. 25, 2024

Related U.S. Application Data

(63) Continuation of application No. PCT/KR2022/005091, filed on Apr. 8, 2022.

(30) Foreign Application Priority Data

Apr. 8, 2021    (KR) .................. 10-2021-0045762

(51) Int. Cl.
 *G06F 1/16*     (2006.01)
 *G06F 1/20*     (2006.01)
(52) U.S. Cl.
 CPC ............ *G06F 1/203* (2013.01); *G06F 1/1616* (2013.01); *G06F 1/1656* (2013.01)
(58) Field of Classification Search
 CPC ....... G06F 1/203; G06F 1/1616; G06F 1/1656
 See application file for complete search history.

(56) References Cited

U.S. PATENT DOCUMENTS 7,894,184 B2    2/2011    Huang et al.
8,120,911 B2    2/2012    Zhou et al.
(Continued)

FOREIGN PATENT DOCUMENTS

CN    101799707 B    2/2012
CN    102006758 B    11/2012
(Continued)

OTHER PUBLICATIONS

International Search Report for PCT/KR2022/005091 mailed Jul. 20, 2022, 5 pages.
(Continued)

*Primary Examiner* — Anthony Q Edwards
(74) *Attorney, Agent, or Firm* — Nixon & Vanderhye, P.C.

(57) ABSTRACT

According to an embodiment, an electronic device comprises: a housing comprising an opening; a cover for opening and closing the opening; and a link structure located inside the housing and connected to the cover, wherein the link structure may comprise: an actuator configured to output power based on the temperature sensed inside the housing; a first link configured to move in a first direction by means of the power; a second link having a resilient structure that, in response to the movement of the first link, is configured to transmit the power in a second direction perpendicular to the first direction and comprises a first spring and a second spring having different elastic forces; and a third link connected to the second link and the cover and configured to convert the cover from a closed state to an open state by transmitting the power in the first direction and a third direction perpendicular to the second direction.

15 Claims, 16 Drawing Sheets

(56) References Cited

U.S. PATENT DOCUMENTS

| | | | |
|---|---|---|---|
| 8,885,335 | B2 | 11/2014 | Magarelli |
| 8,976,524 | B2 | 3/2015 | Wang et al. |
| 9,104,374 | B2 | 8/2015 | Tsai et al. |
| 9,345,167 | B2 | 5/2016 | Hwang |
| 10,678,312 | B2 | 6/2020 | Hsu et al. |
| 11,073,878 | B2* | 7/2021 | Liu .................... G06F 1/203 |
| 11,460,897 | B2* | 10/2022 | Kulkarni ............ H05K 7/20972 |
| 2004/0070942 | A1* | 4/2004 | Tomioka ................ G06F 1/203 174/15.2 |
| 2006/0094347 | A1 | 5/2006 | Tracy et al. |
| 2006/0238439 | A1* | 10/2006 | Fuller ................... G06F 1/1616 345/1.1 |
| 2009/0237881 | A1 | 9/2009 | Harris |
| 2011/0222236 | A1 | 9/2011 | Luo et al. |
| 2013/0027873 | A1 | 1/2013 | Chen et al. |
| 2020/0081505 | A1 | 3/2020 | Ma et al. |
| 2020/0187381 | A1 | 6/2020 | Degner et al. |
| 2020/0313112 | A1 | 10/2020 | Lee et al. |
| 2021/0072806 | A1 | 3/2021 | Sun et al. |
| 2022/0394870 | A1* | 12/2022 | Hwang .................... H05K 5/00 |

FOREIGN PATENT DOCUMENTS

| | | |
|---|---|---|
| CN | 102929368 A | 2/2013 |
| CN | 207589345 U | 7/2018 |
| JP | H05134781 A | 6/1993 |
| JP | 2000-222071 | 8/2000 |
| JP | 3845262 B2 | 8/2006 |
| JP | 2009163589 A | 7/2009 |
| JP | 2099-193350 | 8/2009 |
| JP | 2012-175059 | 9/2012 |
| KR | 20000007817 U | 5/2000 |
| KR | 200300912 Y1 | 1/2003 |
| KR | 20030016104 A | 2/2003 |
| KR | 20070008909 A | 1/2007 |
| KR | 10-2020-0115773 | 10/2020 |

OTHER PUBLICATIONS

Written Opinion of the ISA for PCT/KR2022/005091 mailed Jul. 20, 2022, 3 pages.
Office Action dated Oct. 1, 2025 in Korean Patent Application No. 10-2021-0045762 and English language translation.

* cited by examiner

ELECTRONIC DEVICE INCLUDING HEAT DISSIPATION STRUCTURE

CROSS-REFERENCE TO RELATED APPLICATIONS

This application is a continuation of International Application No. PCT/KR2022/005091 designating the United States, filed on Apr. 8, 2022, in the Korean Intellectual Property Receiving Office and claiming priority to Korean Patent Application No. 10-2021-0045762, filed on Apr. 8, 2021, in the Korean Intellectual Property Office, the disclosures of each of which are incorporated by reference herein in their entireties.

BACKGROUND

Field

The disclosure relates to an electronic device including a heat dissipation structure.

Description of Related Art

An electronic device may include a heat dissipation structure for dissipating heat released from at least one component positioned therein to the outside. If the heat released from at least one component is not dissipated to the outside of the electronic device, or if the electronic device is not cooled, the component may fail to operate normally due to overheating. Overheating may degrade the system performance, or may cause battery explosion in some cases.

Electronic devices such as laptop computers have become slim, and it may thus be difficult to implement a heat dissipation structure for dissipating heat released from at least one component to the outside.

SUMMARY

Embodiments of the disclosure may provide an electronic device including a heat dissipation structure for dissipating heat released from at least one component disposed inside the electronic device to the outside of the electronic device.

According to an example embodiment of the disclosure, an electronic device may include: a housing including an opening, a cover configured to open or close the opening, and a link structure positioned inside the housing and connected to the cover, wherein the link structure includes an actuator configured to output power based on a temperature detected inside the housing, a first link configured to move in a first direction by the power, a second link configured to transmit the power in a second direction perpendicular to the first direction in response to a movement of the first link and including an elastic structure including a first spring and a second spring having different elastic forces, and a third link connected to the second link and the cover and configured to transmit the power in a third direction perpendicular to the first direction and the second direction to switch the cover from a closed state to an open state.

An electronic device including a heat dissipation structure according to various example embodiments of the disclosure may open/close a cover positioned in an air inlet or an air outlet in response to the internal temperature of the electronic device, thereby improving the efficiency of heat dissipation performance and/or aesthetic appearance.

Various other advantageous effects obtainable various embodiments of the disclosure will be disclosed explicitly or implicitly in the detailed description of embodiments of the disclosure. For example, various effects obtainable by various embodiments of the disclosure will be disclosed in the following detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments disclosed herein will be described in greater detail with reference to the accompanying drawings.

Figure 1:
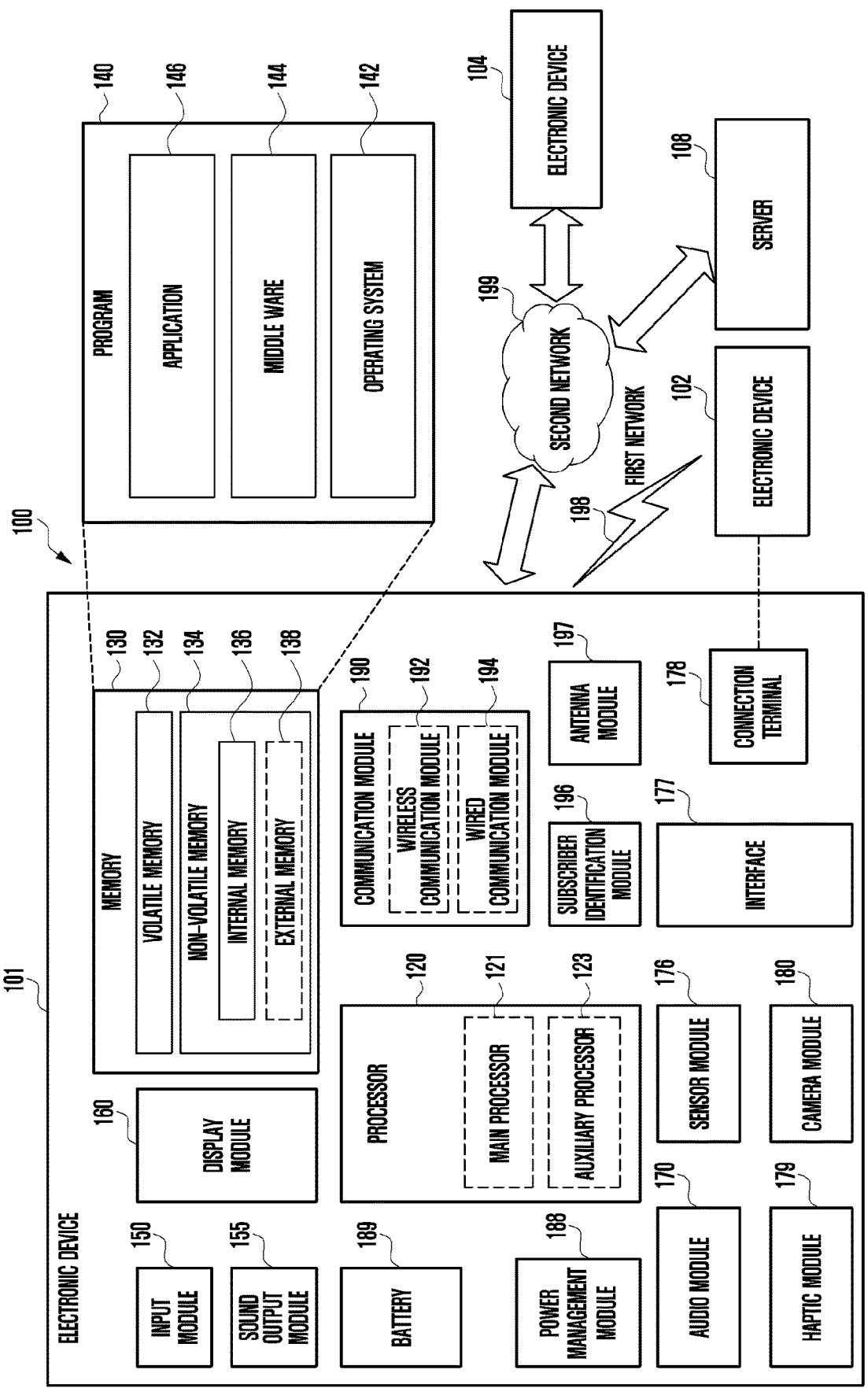
FIG. 1 is a block diagram illustrating an example electronic device in a network environment according to various embodiments.

FIG. 1 is a block diagram of an electronic device 101 in a network environment 100 according to various embodiments.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In various embodiments of the disclosure, at least one (e.g., the connection terminal 178) of the components may be omitted from the electronic device 101, or one or more other components may be added in the electronic device 101. In various embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a 5th generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., external the electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In an embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, a home appliance, or the like. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
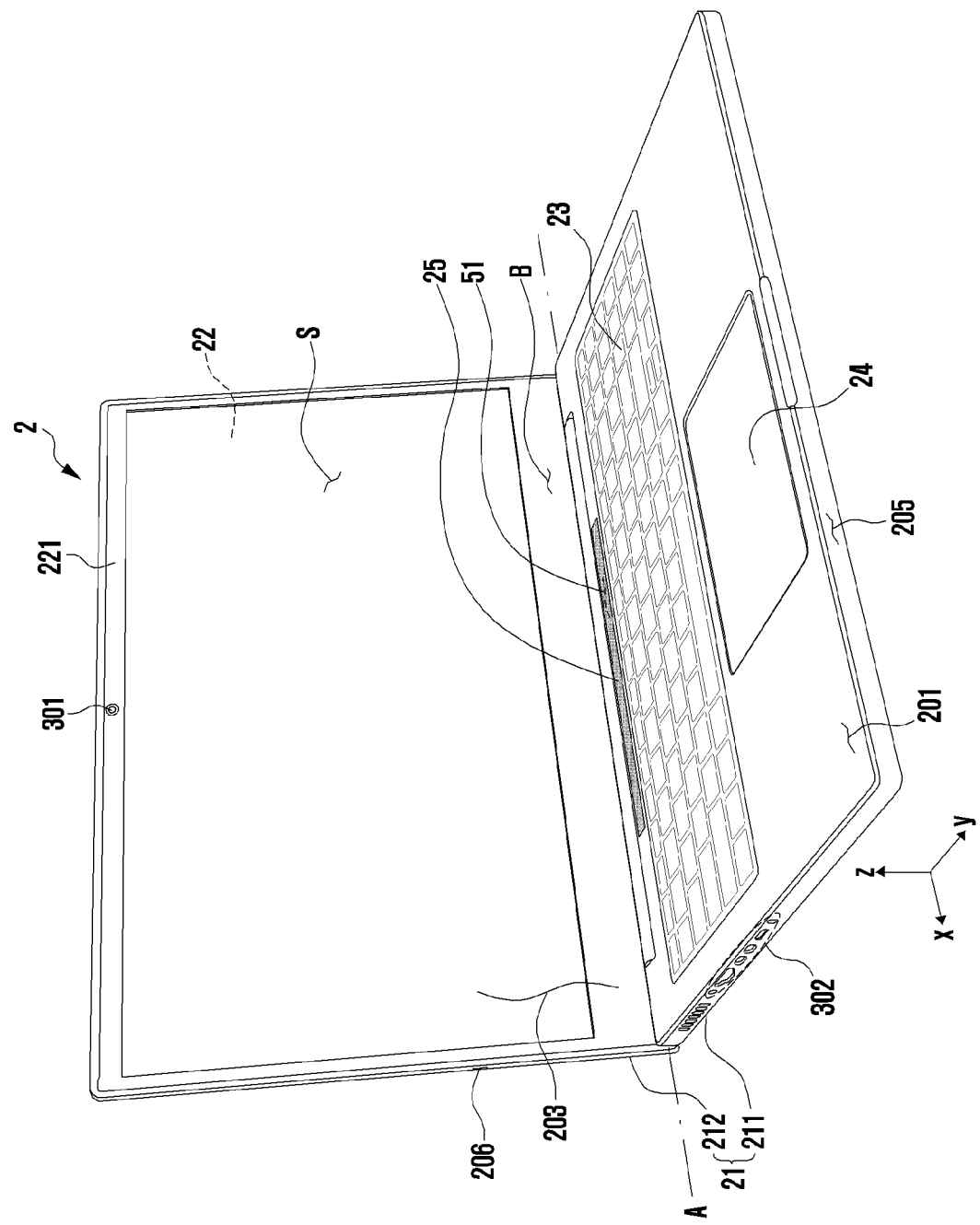
FIG. 2 is a perspective view of an electronic device in an unfolded state according to various embodiments.
Figure 3:
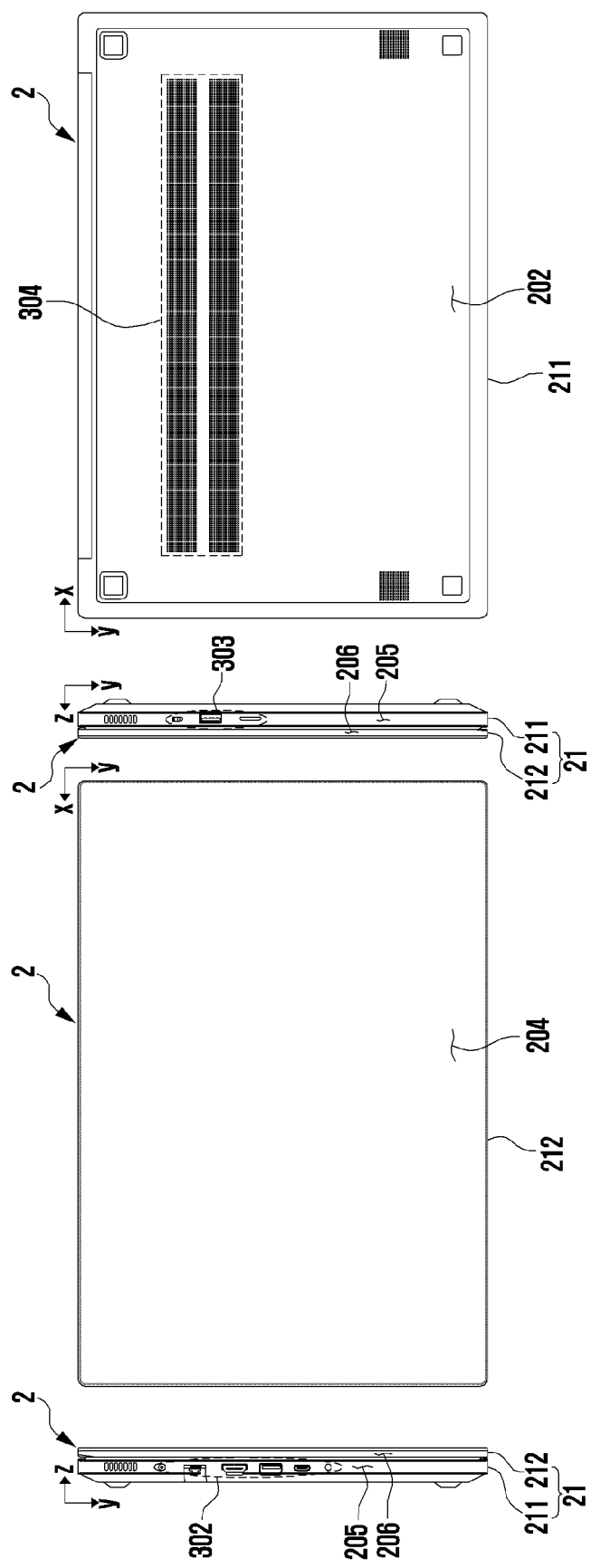
FIG. 3 is a diagram illustrating various views of an electronic device in a folded state according to various embodiments.

FIG. 2 is a perspective view of an electronic device 2 in an unfolded state according to various embodiments. FIG. 3 are diagrams illustrating various views of an electronic device 2 in a folded state seen according to various embodiments.

Referring to FIGS. 2 and 3, in an embodiment, an electronic device 2 may include a foldable housing 21, a display 22, a keyboard 23, a touch pad 24, and/or a cover 25. For example, the electronic device 2 may include a laptop computer (or a notebook computer).

According to an embodiment, the foldable housing 21 may include a first housing (a first housing part or a first housing structure) 211, a second housing (a second housing part or a second housing structure) 212, and/or a hinge assembly. The first housing 211 and the second housing 212 may be connected by the hinge assembly, and may mutually rotate around a folding axis A (e.g., a rotation axis of the hinge assembly) of the foldable housing 21. The hinge assembly may include at least one hinge for connecting the first housing 211 and the second housing 212, and may provide the folding axis A of the foldable housing 21. For example, the first housing 211 or the second housing 212 may be made of ceramic, polymer, metal (e.g., aluminum, stainless steel, or magnesium), or a combination of two or more of the materials. The first housing 211 may include a first surface 201 of the electronic device 2 and a second surface 202 of the electronic device 2, which is disposed at the side opposite to the first surface 201. The first housing 211 may include a first side surface 205 of the electronic device 2, which at least partially surrounds a space between the first surface 201 and the second surface 202. The second housing 212 may include a third surface 203 of the electronic device 2 and a fourth surface 204 of the electronic device 2, which is disposed at the side opposite to the third surface 203. The second housing 212 may include a second side surface 206 of the electronic device 2, which at least partially surrounds a space between the third surface 203 and the fourth surface 204. In various embodiments, the first housing 211 may be referred to as a structure for providing at least a part of the first surface 201, the second surface 202, and the first side surface 205, and the second housing 212 may be referred to as a structure for providing at least a part of the third surface 203, the fourth surface 204, and the second side surface 206. A folded state (see FIG. 3) of the electronic device 2 may refer to a state in which the first housing 211 and the second housing 212 are arranged such that the first surface 201 and the third surface 203 are no longer close to each other. For example, in a folded state of electronic device 2, the first surface 201 and the third surface 203 may face each other to form an angle of about 0 degrees to about 10 degrees, and may not be substantially exposed to the outside. In a folded state of the electronic device 2, the second surface 202 and the fourth surface 204 may be oriented in substantially opposite directions. In a folded state of the electronic device 2, the first side surface 205 and the second side surface 206 may be aligned with each other. An unfolded state (see FIG. 2) of the electronic device 2 may refer to a state other than a folded state of the electronic device 2.

According to various embodiments, the foldable housing 21 may be implemented to have the first housing 211 and the second housing 212 which are arranged to enable that the second surface 202 and the fourth surface 204 become no longer close to each other while facing each other. In this case, for example, the second surface 202 and the fourth surface 204 may form an angle of about 0 degrees to about 10 degrees, and may not be substantially exposed to the outside.

According to an embodiment, the display 22 may be positioned in the second housing 212. For example, the second housing 212 may include a transparent plate 221 for providing at least a part of the third surface 203. The display 22 may be positioned in an inner space of the second housing 212 to at least partially overlap the transparent plate 221. The transparent plate 221 may protect the display 22 from the outside. Light output from the display 22 may pass through the transparent plate 221 and then travel to the outside. A screen S of the electronic device 2 may refer, for example, to an area capable of displaying an image in a device including the display 22 and the transparent plate 221, and for example, may include a display area (or an active area) of the display 22 and a partial area of the transparent plate 221, which is overlapped with the display area. In various embodiments, the transparent plate 221 may be an element included in the display 22 and may be integrally provided with the display 22. The transparent plate 221 may include various materials such as polymer or glass. In various embodiments, the transparent plate 221 may include multiple layers. For example, the transparent plate 221 may have a form in which a protective layer or a coating layer made of various polymer materials (e.g., polyester (PET), polyimide (PI), or thermoplastic polyurethane (TPU)) is disposed on a plastic plate or glass plate. The edge area of the third surface 203, which surrounds the screen S, may be substantially opaque, and for example, may provide a screen bezel B. For example, an opaque material may be disposed on the rear surface of an area, which corresponds to the screen bezel B, of the transparent plate 221. The screen S is not limited to the illustrated example, and may be further enlarged. For example, the ratio occupied by the screen S of the third surface 203 may be about 90% or more (e.g., a bezel-less display or a full screen display). In various embodiments, the second housing 212 may include a screen bezel B including an opening, and the display 22 may also be disposed in the opening to provide the third surface 203 together with the screen bezel B. In various embodiments, the display 22 may include a touch sensor (or a touch detection circuit) configured to detect a touch of the display 22 or a pressure sensor configured to measure an intensity of a force generated by the touch. In various embodiments, the display 22 may include an electromagnetic induction panel (e.g., a digitizer) for detecting a magnetic field type pen input device (e.g., a stylus pen), or may be coupled to an electromagnetic induction panel.

For example, the electronic device 2 may be the electronic device 101 in FIG. 1 or may include at least one of the elements included in the electronic device 101 in FIG. 1. In an embodiment, the electronic device 2 may include an input module (e.g., the input module 150 in FIG. 1), a sound output module (e.g., the sound output module 155 in FIG. 1), a camera module 301 (e.g., the camera module 180 in FIG. 1), a sensor module (e.g., the sensor module 176 in FIG. 1), or multiple connection terminals 302 and 303 (e.g., the connection terminal 178 in FIG. 1). In various embodiments, at least one of the elements of the electronic device 2 may be omitted, or the electronic device may additionally include other elements. The position or the number of elements included the electronic device 2 is limited to the illustrated example, and may be various.

For example, the input module may include the keyboard 23. The keyboard 23 may be positioned on the first housing 211. The first housing 211 may include multiple openings provided in the first surface 201, and multiple buttons (or keys) of the keyboard 23 may be positioned in the multiple openings to be exposed to the outside. The input module may further include another key input device (e.g., a power button) separated from the keyboard 23. The key input device may be positioned on the first surface 201 or the first side surface 205. However, it is not limited thereto, and the position or the number thereof may be various. In various embodiments, at least one key input device may be positioned on second housing 212. In various embodiments, at least one key input device may be omitted, and the omitted key input device may be implemented in another form such as a soft key on the display 22.

For example, the input module may include the touch pad 24. The touch pad 24 may be positioned on the first housing 211. The touch pad 24 may be a pointing device exposed on the first surface 201, and may include a touch detection circuit embedded in the surface or disposed on a substrate (not shown) disposed along the surface. The touch pad 24 may include a cover area for providing a part of the first surface 201 by at least partially overlapping the substrate including the touch detection circuit. The cover area may be substantially opaque. The cover area exposed to the outside may provide a touch input surface for receiving or detecting a touch by a user input. For example, in case that a finger touches the touch input surface or reaches within a threshold distance from the touch input surface, a signal associated with a coordinate may be generated. There may be a click button (e.g., a push switch including a metal dome), below the touch pad 24. In case that the touch input surface is pressed, an input may be generated from the push button.

For example, the input module may include a microphone positioned inside the electronic device 2 and a microphone hole provided through the first housing 211 or the second housing 212 to correspond to the microphone. The position or the number of the input modules including the microphone and the microphone hole corresponding thereto may be various. In various embodiments, the electronic device 2 may include multiple microphones capable of detecting a direction of sound.

For example, the input module may include at least one sensor. In an embodiment, the input module may include a touch sensor (or touch detection circuit) or a pressure sensor positioned on or included in the display 22. In various embodiments, the input module may include at least one sensor included in the sensor module 176 in FIG. 1. In various embodiments, for example, the input module may include an electromagnetic induction panel (e.g., a digitizer) positioned on or included in the display 22.

According to various embodiments, the electronic device 2 may be implemented by omitting some of input modules or adding other input modules according to the type of provision or a convergence trend. In various embodiments, the display 22 including a touch sensor (or touch detection circuit) or a pressure sensor as an input module is not limited to the illustrated example, and may be implemented as a foldable display or a flexible display enlarged to the first housing 211. For example, in case that the display 22 is implemented as a flexible display enlarged to the first housing 211, the flexible display may include a first display area corresponding to the first housing 211, a second display area corresponding to the second housing 212, and a third display area corresponding to a hinge assembly (e.g., a folding unit) for connecting the first housing 211 and the second housing 212. According to an angle formed by the first housing 211 and the second housing 212, the third display area may be disposed in an unfolded state or a bent state. In case that the display 22 is implemented as a flexible display extended to the first housing 211, the keyboard 23 or the touch pad 24 may be omitted. The omitted keyboard 23 or touch pad 24 may be implemented in a form displayed through a flexible display (or a first display area).

For example, the sound output module may include a speaker positioned inside the electronic device 2, and a speaker hole provided through the first housing 211 or the second housing 212 to correspond to the speaker. The position or the number of the sound output modules including the speaker and the speaker hole corresponding thereto may be various. In various embodiments, the microphone hole and the speaker hole may be implemented as one hole. In various embodiments, a piezo speaker in which a speaker hole is omitted may also be implemented.

For example, the camera module 301 may be positioned inside the second housing 212 to correspond to the screen bezel B. The camera module 301 may include one lens or multiple lenses, an image sensor, and/or an image signal processor. The position or the number of the camera modules 301 is not limited to the illustrated example and may be various.

According to various embodiments, the display 22 may include an opening aligned with the camera module 301. External light may reach the camera module 301 through the transparent plate 221 and the opening of the display 22. In various embodiments, an opening of the display 22 may also be provided in a notch shape according to the position of the camera module 301. In various embodiments, the camera module 301 may be disposed at the lower end the display 22, and may perform a related function (e.g., image photographing) while the position of the camera module 301 is not visually distinguished (exposed). For example, the camera module 301 may be positioned on the rear surface of the display 22, or below or beneath the display 22, and may include a hidden under-display camera (UCC). In various embodiments, the camera module 301 may be positioned to be aligned with a recess provided on the rear surface of the display 22. The camera module 301 may be disposed to overlap at least a part of the screen S, and may obtain an image of an external subject without being visually exposed to the outside. In this case, a partial area of the display 22, which at least partially overlaps the camera module 301, may include a different pixel structure and/or wire structure compared to the other areas. For example, a partial area of the display 22, which at least partially overlaps the camera module 301, may have a different pixel density compared to other areas. The pixel structure and/or wire structure provided in a partial area of the display 22, which at least partially overlaps the first camera module 301, may reduce the loss of light between the outside and the camera module 301. In various embodiments, a pixel may also not be disposed in a partial area of the display 22, which at least partially overlaps the camera module 301. In various embodiments, the camera module 301 may be implemented as multiple camera modules (e.g., a dual camera module or a triple camera module) having different properties (e.g., angles of view) or functions, respectively. A camera module, which includes multiple camera modules including lenses having different view angles, respectively, may be included therein, and the electronic device 2 may control to change a view angle of the camera module, which is performed in the electronic device 2, based on a user selection. The multiple camera modules may include at least one of a wide-angle camera, a telephoto camera, a color camera, a monochrome camera, or an infrared (IR) camera (e.g., a time of flight (TOF) camera or a structured light camera). In various embodiments, the IR camera may also be operated as at least a part of a sensor module.

The sensor module may be configured to generate electric signals or data values corresponding to an internal operation state of the electronic device 2 or an external environment state. For example, the sensor module may include at least one of a proximity sensor, a gesture sensor, a gyro sensor, a barometric pressure sensor, a magnetic sensor, an acceleration sensor, a grip sensor, a color sensor, an infrared (IR) sensor, a biometric sensor (e.g., a fingerprint sensor, an HRM sensor), a temperature sensor, a humidity sensor, or an illuminance sensor.

According to an embodiment, the sensor module may include an optical sensor positioned inside the second housing 212 to correspond to the screen bezel B. For example, the optical sensor may include a proximity sensor or an illuminance sensor.

According to various embodiments, the optical sensor may be aligned with the opening provided in the display 22. External light may be introduced into the optical sensor through the transparent plate 221 and the opening of the display 22. In various embodiments, the optical sensor may be disposed at the lower end of the display 22, and may perform related functions while the position of the optical sensor is not visually distinguished (or exposed). For example, the optical sensor may be positioned on the rear surface of the display 22, or below or beneath the display 22. In various embodiments, the optical sensor may be positioned to be aligned with a recess provided on the rear surface of the display 22. The optical sensor may be disposed to overlap at least a part of the screen S, and may perform a sensing function without being exposed to the outside. In this case, a partial area of the display 22, which at least partially overlaps the optical sensor, may include a different pixel structure and/or wire structure compared to the other areas. For example, a partial area of the display 22, which at least partially overlaps the optical sensor, may have a different pixel density compared to other areas. In various embodiments, the sensor module may include an ultrasonic sensor positioned below the display 22. A pixel structure and/or wire structure provided in a partial area of the display 22, which at least partially overlaps the sensor module, may reduce the loss thereof in case that various types of signals (e.g., light or ultrasonic waves) related to the sensor module pass between the outside and the sensor module. In various embodiments, multiple pixels may not be arranged in a partial area of the display 22, which at least partially overlaps the sensor module.

For example, the multiple connection terminals 302 and 303 (e.g., the interface 177 in FIG. 1) may include connectors (e.g., an HDMI connector, a USB connector interface, an SD card connector, or an audio connector) positioned inside the electronic device 2, and connector holes provided through the first housing 211 to correspond to the connectors. The electronic device 2 may transmit and/or receive electric power and/or data to and/or from an external electronic device electrically connected to the connectors through the connector holes. The position or the number of the connectors and the connector holes corresponding thereto is not limited to the illustrated example, and may be various.

According to various embodiments, the electronic device 2 may include a detachable pen input device (e.g., an electronic pen, a digital pen, or a stylus pen).

For example, the electronic device 2 may include a heat dissipation structure for dissipating, to the outside, heat emitted from at least one component positioned inside the electronic device 2. The at least one component may include a resistance ingredient, and in case that the at least one component consumes a current, a portion of the current may be converted into thermal energy and then dissipated by the resistance ingredient. At least one component associated with the heat dissipation structure may be distinguished from a component for intentionally dissipating heat. For example, at least one component associated with the heat generation structure may include power devices or multiple integrated circuits (ICs) (e.g., a processor or a wireless communication module) arranged on a printed circuit board positioned in the first housing 211. In an embodiment, the heat dissipation structure may include a first opening 51 provided in the first surface 201 of the first housing 211. When the first housing 211 is seen from above the first surface 201, the first opening 51 may be positioned between the keyboard 23 and the folding axis A. The heat dissipation structure may allow external air (outdoor air) to be introduced (or suctioned) into the first housing 211 through the first opening 51, and the first opening 51 may be referred to as an air suction hole of the heat dissipation structure. The heat dissipation structure may allow external air to receive heat emitted from the at least one component and then same to be discharged to the outside through another opening (e.g., an air discharge hole) of the first housing 211. In various embodiments, the first opening 51 may also be implemented as an air discharge hole through which air received heat emitted from the at least one component is discharged from the inner space of the first housing 211 to the outside. For example, the heat dissipation structure may be an air suction hole or an air discharge hole, and may include multiple openings (not shown) provided in the first side surface 205 of the first housing 211. For example, the heat dissipation structure may be an air suction hole or an air discharge hole, and may include multiple openings 304 provided in the second surface 202 of the first housing 211.

According to an embodiment, the heat dissipation structure may include a link structure (or a link assembly) positioned inside the first housing 211. The link structure may be connected to the cover 25. The cover 25 may open or close the first opening 51 by the link structure. The angle or the speed, at which the cover 25 is opened, may be adjusted by the link structure.

Figure 4:
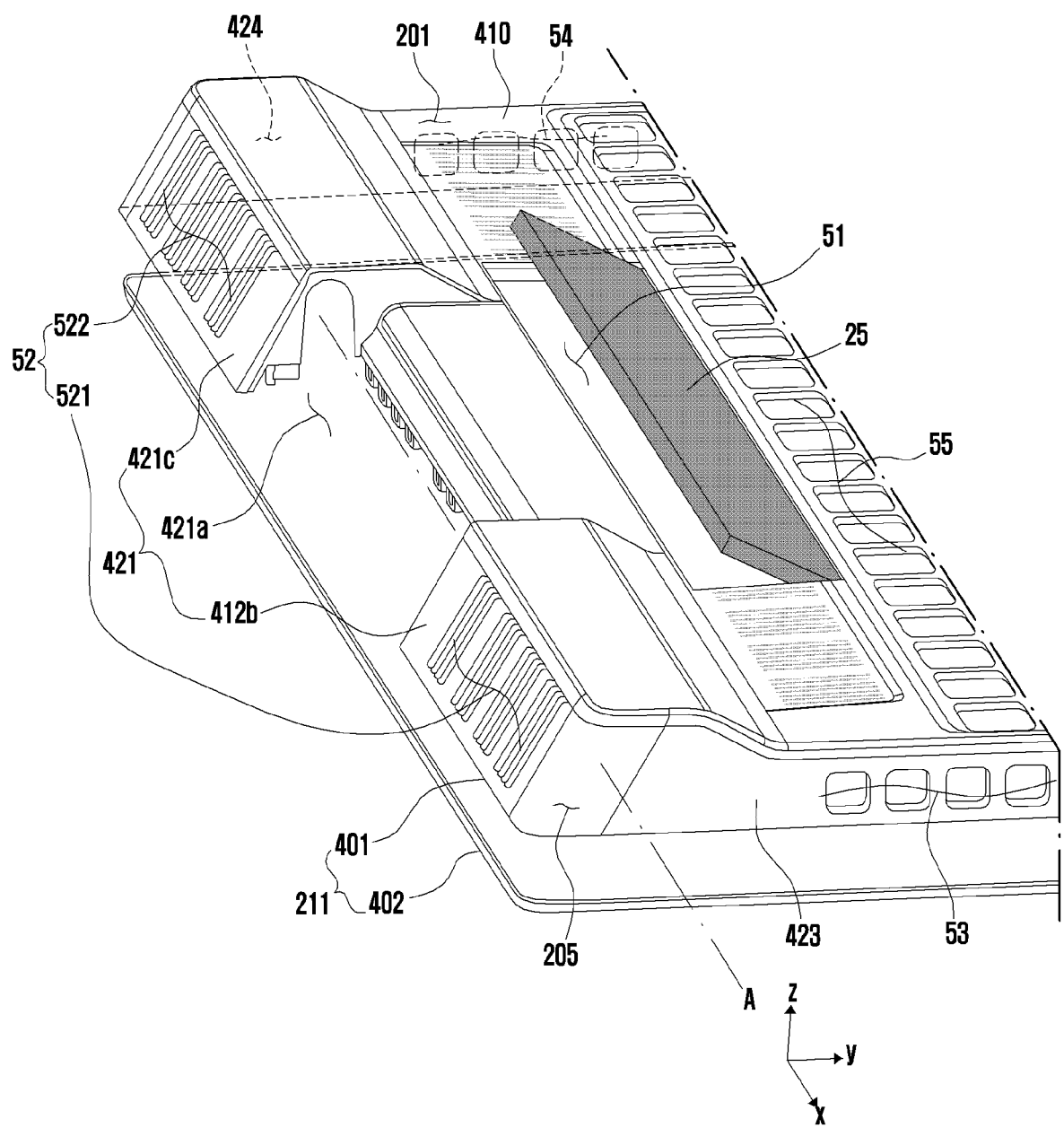
FIG. 4 is a perspective view illustrating a first housing and a cover according to various embodiments.
Figure 5:
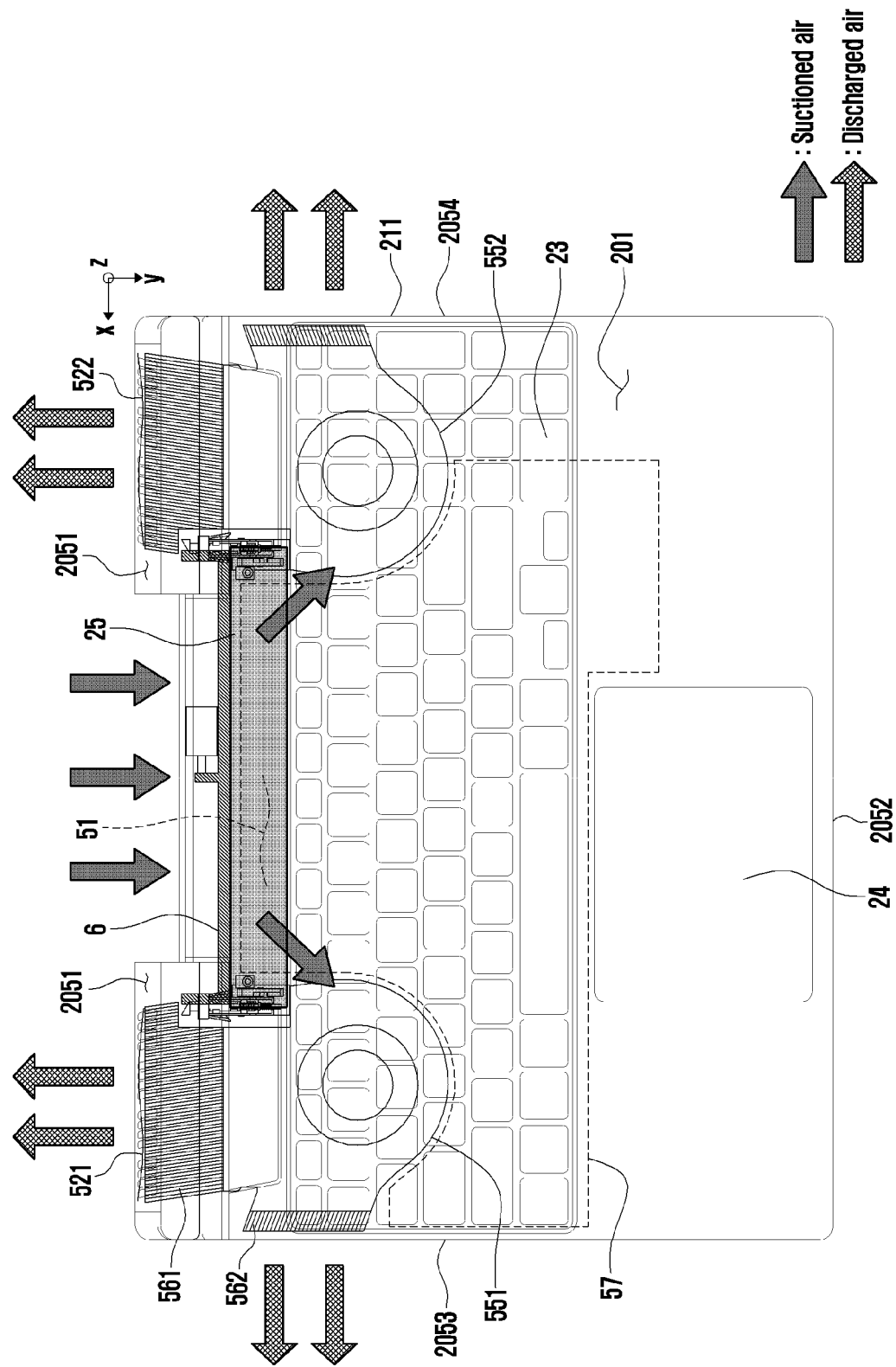
FIG. 5 is diagram illustrating a plan view when a first housing is seen from above a first surface according to various embodiments.

FIG. 4 is a perspective view illustrating a first housing 211 and a cover 25 according to various embodiments. FIG. 5 is a diagram illustrating a plan view when a first housing 211 is seen from above a first surface 201 according to various embodiments.

Referring to FIGS. 4 and 5, FIG. 4 illustrates the cover 25 in an open state, and FIG. 5 illustrates the cover 25 in a closed state. The first housing 211 may include the first surface 201, the second surface 202 (see FIG. 3), and the first side surface 205. The first side surface 205 may include a first side-surface area 2051, a second side-surface area 2052, a third side-surface area 2053, or a fourth side-surface area 2054. For example, the first side-surface area 2051 and the second side-surface area 2052 may be substantially parallel to the folding axis A, and may be arranged at sides opposite to each other. For example, the third side-surface area 2053 and the fourth side-surface area 2054 may be substantially perpendicular to the folding axis A, and may be arranged at sides opposite to each other.

According to an embodiment, the first housing 211 may include a first case 401 for providing the first surface 201 and the first side surface 205, and a second case 402 (e.g., a rear cover) for providing at least part of the second surface 202. The first case 401 may include a plate 410 for providing the first surface 201, a first side wall 421 for providing the first side-surface area 2051, and a second side wall (not shown) for providing the second side-surface area 2052, a third side wall 423 for providing the third side-surface area 2053, and/or a fourth side wall 424 for providing the fourth side-surface area 2054. The plate 410 may be integrally provided with the first side wall 421, the second side wall 422, the third side wall 423, and/or the fourth side wall 424, and may include the same material (e.g., polymer or metal material). The first side wall 421 may be rotatably connected to the second housing 212 (see FIG. 2). For example, the first side wall 421 may include a recess 421a, a first hinge arm 421b, and/or a second hinge arm 421c. The recess 421a may be provided between the first hinge arm 421b and the second hinge arm 421c. A part of the second housing 212 (see FIG. 2) may be positioned in the recess 421a, and may be rotatably hinge-connected to the first hinge arm 421b and the second hinge arm 421c.

According to an embodiment, the first housing 211 may include the first opening 51, multiple second openings 521 and 522, multiple third openings 53, multiple fourth openings 54, and/or multiple fifth openings 55. The first opening 51 may be provided in the plate 410. The multiple second openings 521 and 522 may be provided in the first side wall 421. The multiple second openings 521 and 522 may include one or more second openings 521 positioned at the side of the first hinge arm 421b, and one or more second openings 522 positioned at the side of the second hinge arm 421c. One or more second openings 521 at one side and one or more second openings 522 at the other side may be arranged substantially symmetrical to each other with reference to the recess 421a of the first side wall 421. The multiple third openings 53 may be provided in the third side wall 423. The multiple fourth openings 54 may be provided in the fourth side wall 424. When seen from above the plate 410 (e.g., when seen in the −z-axis direction), the multiple third openings 53 and the multiple fourth openings 54 may be arranged symmetrically to each other with reference to the recess 421a of the first side wall 421. In an embodiment, the first opening 51 may function as an air suction hole of a heat dissipation structure, through which external air is introduced (or suctioned) into the inner space of the first housing 211, and the multiple second openings 52, the multiple third openings 53, and/or the multiple fourth openings 54 may function as an air discharge hole of the heat dissipation structure, through which air is discharged from the inner space of the first housing 211 to the outside. In various embodiments, the first opening 51 may also be implemented as an air discharge hole of the heat dissipation structure, through which air is discharged from the inner space of the first housing 211 to the outside. The multiple fifth openings 55 may be provided in the plate 410. Multiple buttons of the keyboard 23 may be positioned in the multiple fifth openings 55 to be exposed to the outside.

According to an embodiment, the heat dissipation structure may include a first blower 551 and/or a second blower 552 associated with the air suction hole (e.g., the first opening 51) and the air discharge hole (e.g., the multiple second openings 52, the multiple third openings 53, or the multiple fourth openings 54). The first blower 551 and the second blower 552 may be positioned inside the first housing 211 to cause air flow. For example, the first blower 551 or the second blower 552 may include a fan or a cooling fan. When seen from above the first surface 201, the first blower 551 and the second blower 552 may be arranged substantially symmetrical to each other with reference to the first opening 51. Due to the flow of air by the first blower 551 and the second blower 552, a pressure difference may occur between the inside of the first housing 211 and the outside of the first housing 211, and due to this, external air (outdoor air) may be introduced (or suctioned) into the first housing 211 through the first opening 51. Due to forced convection by the first blower 551 and the second blower 552, the air suctioned through the first opening 51 may receive heat emitted from at least one component, and then may flow into air suction parts of the first blower 551 and the second blower 552 and then be discharged through air discharge parts of the first blower 551 and the second blower 552. For example, the first blower 551 may include a first air discharge part corresponding to the one or more second openings 521 and a second air discharge part corresponding to the multiple third openings 53. The second blower 552 may include a third air discharge part corresponding to the one or more second openings 522 and a fourth air discharge part corresponding to the multiple fourth openings 54. At least one component for emitting heat may be disposed on a printed circuit board 57 positioned inside the first housing 211. In various embodiments, the first opening 51 may be referred to as an inlet vent, and the multiple second openings 52, the multiple third openings 53, and the fourth openings 54 may be referred to as outlet vents.

According to various embodiments, the heat dissipation structure may include a first heat conduction structure (or a first heat transfer structure) connected to the first blower 551. The first heat conduction structure may include a first heat conduction member (not shown) for receiving heat emitted from at least one component, a second heat conduction member 561 positioned to be aligned with the one or more second openings 521, a third heat conduction member 562 positioned to be aligned with the multiple third openings 53, a fourth heat conduction member (not shown) between the first heat conduction member and the second heat conduction member 561, and a fifth heat conduction member (not shown) between the first heat conduction member and third heat conduction member 562. The second heat conduction member 561 may be positioned in the first air discharge part of the first blower 551, which corresponds to the one or more second openings 521 of the first housing 211. The third heat conduction member 562 may be positioned in the second air discharge part of the first blower 551, which corresponds to the multiple third openings 53 of the first housing 211. By conduction in which heat flows from a high-temperature part to a low-temperature part, heat emitted from at least one component may move from the first heat conduction member to the second heat conduction member 561 via the fourth heat conduction member, or may move from the first heat conduction member to the third heat conduction member 562 via the fifth heat conduction member. For example, the first heat conduction member may include a heat spreader in the form of a patch disposed on the printed circuit board 57. The fourth heat conduction member or the fifth heat conduction member may include a heat pipe or a vapor chamber. The second heat conduction member 561 or the third heat conduction member 562 may include a heat sink. Convective heat transfer, which is a method in which energy is transferred between a solid surface and gas, may be applied between the second heat conduction member 561 and air, and as a result, heat may be discharged to the outside through the one or more second openings 521. Convective heat transfer, which is a method in which energy is transferred between a solid surface and gas, may be applied between the third heat conduction member 562 and air, and as a result, heat may be discharged to the outside through the multiple third openings 53. Due to forced convection by the first blower 551, performance of convection heat transfer between the second heat conduction member 561 and air, and convective heat transfer between the third heat conduction member 562 and air may be ensured. The heat dissipation structure may include a second heat conduction structure (or a second heat transfer structure) connected to the second blower 552. The second heat conduction structure may be implemented to correspond to the one or more second openings 522 and the multiple fourth openings 54 in substantially the same manner as the first heat conduction structure connected to the first blower 551. According to an embodiment, the heat dissipation structure may include a link structure (or a link assembly) 6 positioned inside the first housing 211. The link structure 6 may be connected to the cover 25, and the cover 25 may open or close the first opening 51 (e.g., an air suction hole) by the link structure 6. The link structure 6 may be driven by itself or according to the control of a processor (e.g., the processor 120 in FIG. 1). In an embodiment, the link structure 6 may be driven based on the temperature detected inside the first housing 211 or the heat emitted from at least one component in the first housing 211.

According to various embodiments, the cover 25 and the link structure 6 connected to the cover 25 are not limited to the illustrated embodiment, and may be positioned to correspond to an air suction hole or an air discharge hole provided at various positions of the electronic device 2. For example, the cover 25 and the link structure 6 may be positioned to correspond to an air suction hole or an air discharge hole provided at various positions such as the first side surface 205 (see FIG. 4) or the first side wall 421 (see FIG. 4) of the electronic device 2. In various embodiments, an electronic device including the cover 25 and the link structure 6 corresponding to an air suction hole or air discharge hole may be implemented as various types of foldable electronic devices which are not limited to the illustrated example.

Figure 6:
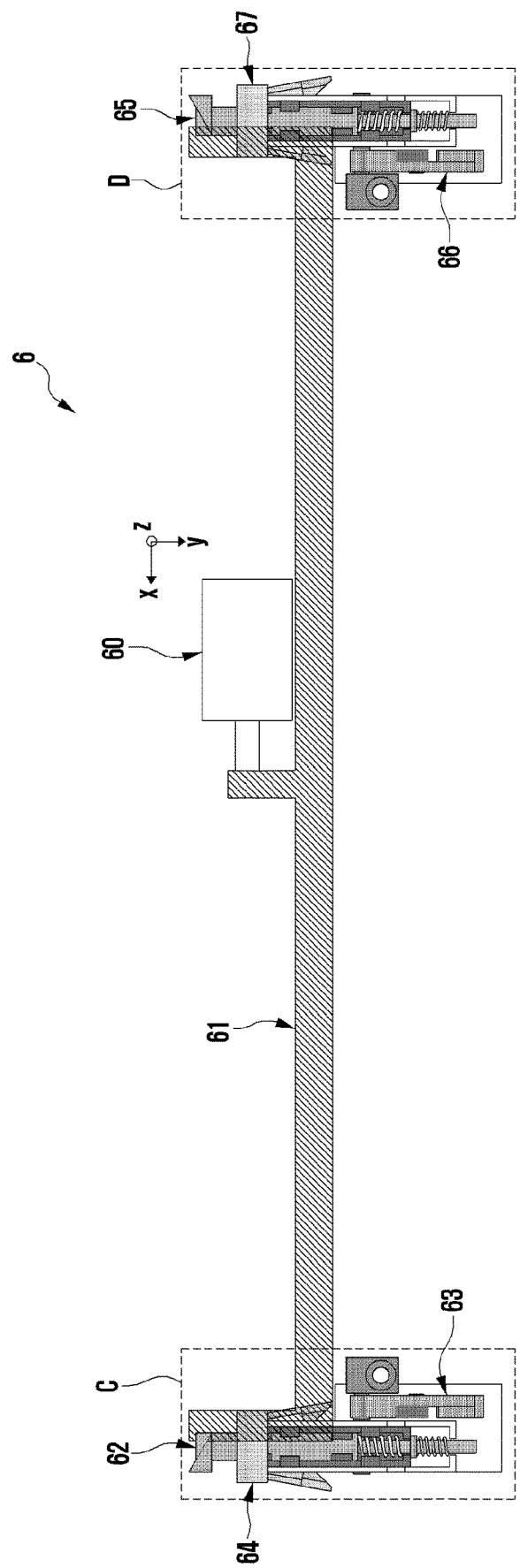
FIG. 6 is a diagram illustrating a plan view of a link structure in a closed state of a cover according to various embodiments.
Figure 7:
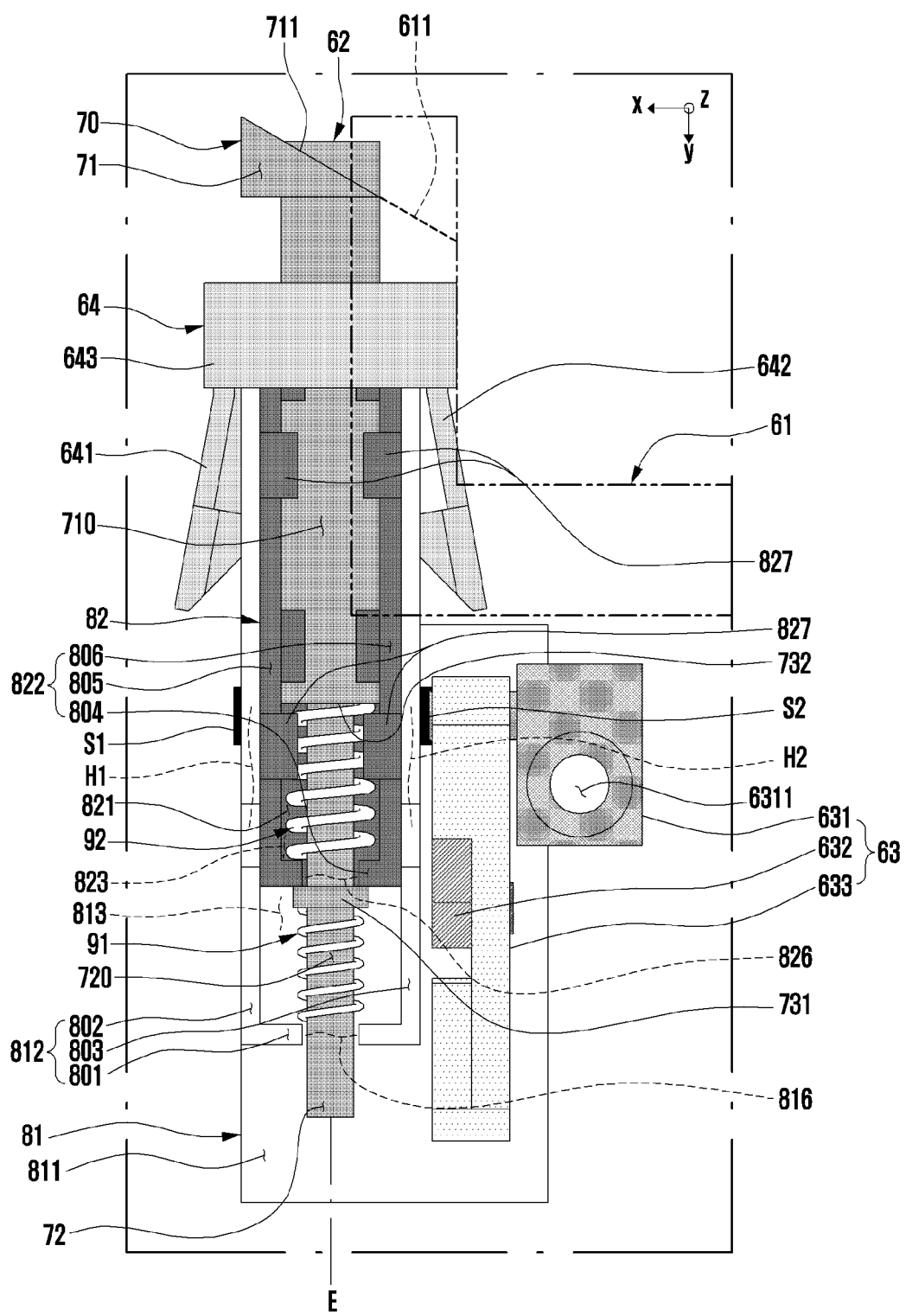
FIG. 7 is a diagram illustrating an enlarged view of the portion indicated by reference numeral 'C' illustrated in FIG. 6 according to various embodiments.
Figure 8:
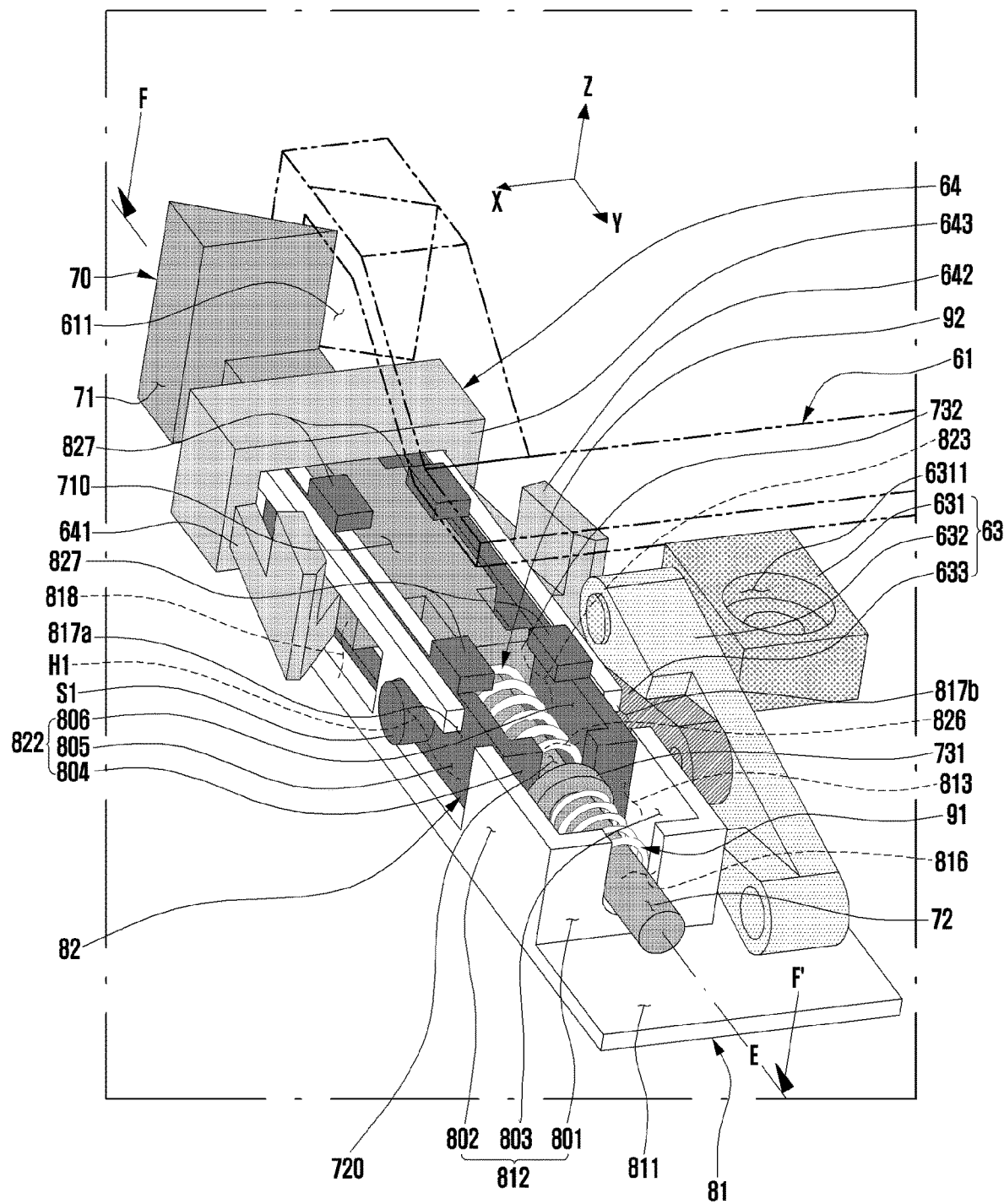
FIG. 8 is a perspective view of the portion indicated by reference numeral 'C' illustrated in FIG. 6 according to various embodiments.
Figure 9:
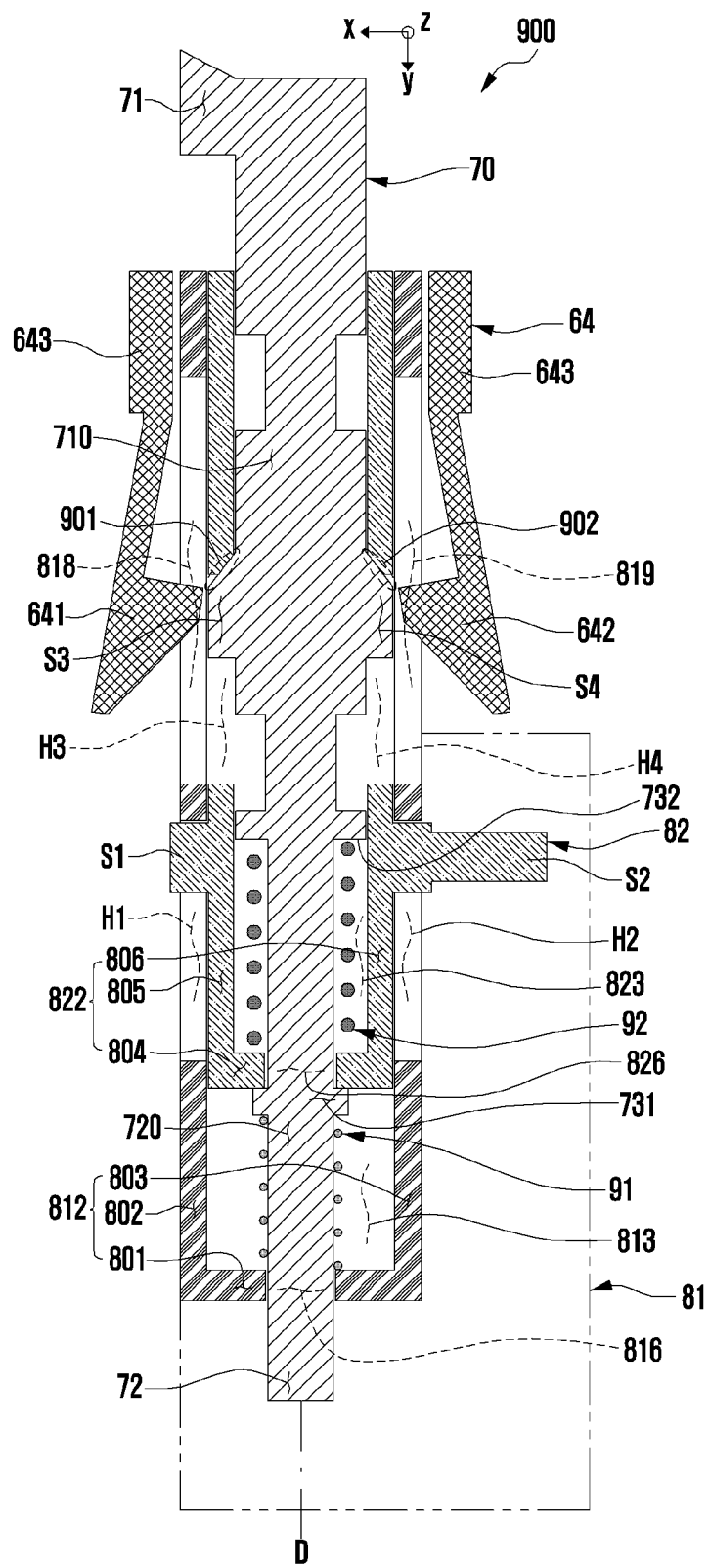
FIG. 9 is a cross-sectional view on the x-y plane taken along line F-F' in FIG. 8 according to various embodiments.
Figure 10:
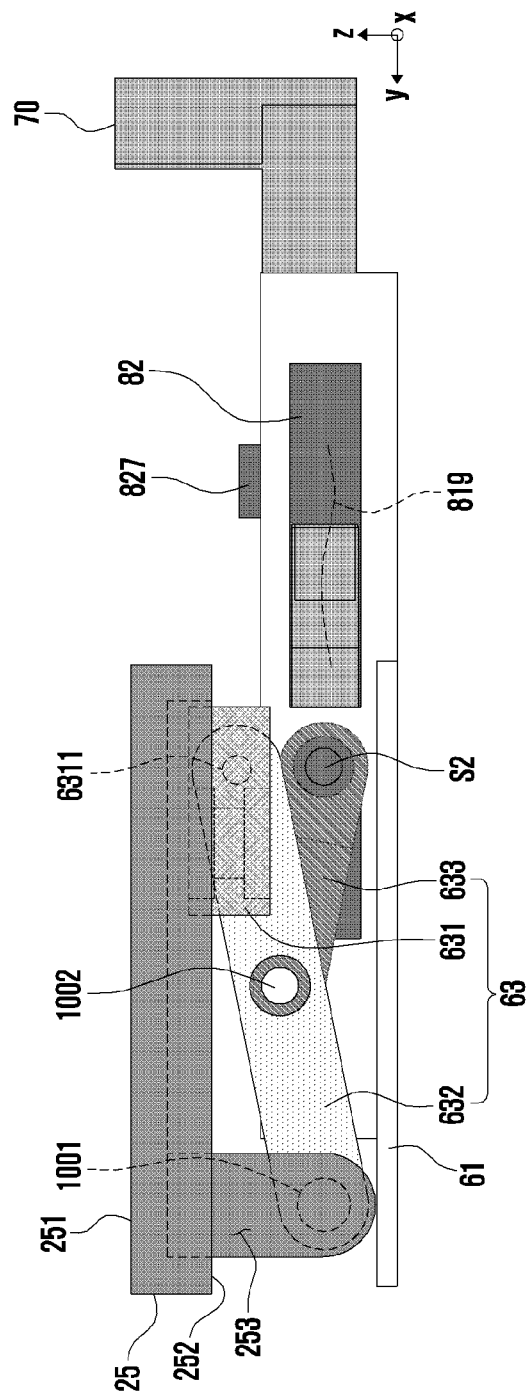
FIG. 10 is a diagram illustrating a side view of a part of a link structure when the portion indicated by reference numeral 'C' in FIG. 6 is seen in the +x-axis direction according to various embodiments.

FIG. 6 is a diagram illustrating a plan view of a link structure 6 in a closed state (see FIG. 5) of a cover 25 according to various embodiments. FIG. 7 is a diagram illustrating an enlarged view of the portion indicated by reference numeral 'C' illustrated in FIG. 6 according to various embodiments. FIG. 8 is a perspective view of the portion indicated by reference numeral 'C' illustrated in FIG. 6 according to various embodiments. FIG. 9 is a cross-sectional view 900 on the x-y plane taken along line F-F' in FIG. 8 according to various embodiments. FIG. 10 is a diagram illustrating a side view of a part of a link structure 6 when the portion indicated by reference numeral 'C' in FIG. 6 is seen in the +x-axis direction according to various embodiments.

Referring to FIGS. 6, 7, 8, and 9, in an embodiment, the link structure 6 may include an actuator 60, a first link 61, a second link 62, a third link 63, and/or a hook structure 64.

According to an embodiment, power output from the actuator 60 may be transmitted to the third link 63 through the first link 61 and the second link 62, and thus the cover 25 connected to the third link 63 may be switched from a closed state (see FIG. 5) to an open state (see FIG. 4). The first link 61 may transmit a force or motion, between the actuator 60 and the second link 62. The second link 62 may transmit a force or motion, between the first link 61 and the third link 63. The actuator 60 may be driven based on the temperature detected inside the first housing 211 (see FIG. 5) or the heat emitted from at least one component in the first housing 211. For example, in case that the temperature detected inside the first housing 211 or the amount of heat emitted from at least one component in the first housing 211 is greater than a threshold value, the actuator 60 may move the first link 61 in a first direction (e.g., the +x-axis direction).

According to an embodiment, the actuator 60 may be driven by itself, without an electrical signal, based on the temperature detected inside the first housing 211 (see FIG. 5) or the heat emitted from at least one component in the first housing 211. For example, the actuator 60 may generate power for moving the first link 61 in the first direction (e.g., +x-axis direction) using a bimetal deformed in response to a temperature.

According to various embodiments, the actuator 60 may generate power using an electrical signal. The actuator 60 may be driven according to the control of a processor (e.g., the processor 120 in FIG. 1). For example, the actuator 60 may be implemented to generate power transmitted to the first link 61 using a motor. The actuator 60 may generate power for moving the first link 61 in the first direction (e.g., the +x-axis direction) using a motorized gear (a gear drive) connected to be driven to a motor. For another example, the actuator 60 may be implemented to generate power transmitted to the first link 61 using a solenoid. For example, the solenoid may include a coil and a plunger positioned to correspond to the coil, and may generate a mechanical movement of the plunger in case that a current is supplied to the coil.

According to an embodiment, the actuator 60 may be disposed in the first housing 211 (see FIG. 5) or may be disposed on a bracket (e.g., a support structure) positioned inside the first housing 211. The bracket may be a frame structure which contributes to enabling the first housing 211 to withstand a load, and may contribute to the durability or rigidity of the electronic device 2. The bracket 211 may be connected to the first housing 211 or be integrally provided with the housing 211. For example, various elements such as the keyboard 23, the touch pad 24, the printed circuit board 57, the first blower 551, the second blower 552, or the link structure 6 (see FIG. 5) may be arranged on the bracket using various fastening methods such as bolt fastening.

According to an embodiment, the first link 61 may be connected to be driven to the actuator 60 and the second link 62. The first link 61 may transmit, to the second link 62, power output from the actuator 60. For example, the first link 61 may include a shaft for connecting the actuator 60 and the second link 62. According to the power transmitted from the actuator 60, a first movement distance and a first movement speed, at which the first link 61 moves in the first direction (e.g., +x-axis direction), may be various.

According to an embodiment, the link structure 6 may further include a support structure (not shown) which allows the first link 61 to be substantially moved in the first direction and allows the first link not to be separated from the link structure 6. For example, the support structure may be disposed on the rear surface of the plate 410 (see FIG. 4) of the first housing 211. For another example, the plate 410 may be provided to include the support structure.

According to an embodiment, the second link 62 may be connected to be driven to the first link 61 and the third link 63. In case that the first link 61 is moved to the first direction (e.g., the +x-axis direction) by the power output from the actuator 60, the second link 62 may transmit the power in a second direction (e.g., the +y-axis direction) perpendicular to the first direction to correspond to the first movement distance of the first link 61. For example, in case that the first link 61 is moved in the first direction by the power output from the actuator 60, by the transmission of a force or motion between the first link 61 and the second link 62, the second link 62 may move a portion (e.g., the second support structure 82) connected to the third link 63 in the second direction which is not parallel to the first direction. In an embodiment, the second direction may be orthogonal to the first direction. According to the first movement distance and the first movement speed at which the first link 61 moves in the first direction (e.g., the +x-axis direction), a second movement distance and a second movement speed at which a portion (e.g., the second support structure 82), connected to the third link 63, of the second link moves in the second direction (e.g., the +y-axis direction), may vary.

According to an embodiment, the second link 62 may be implemented based on an elastic structure (or a resilient structure) and thus may be elastically connected to the first link 61 and the third link 63. For example, the elastic structure of the second link 62 may contribute to a stable motion conversion based on the elastic effect between the first link 61 and the third link 63, in a state change (e.g., the switching between a closed state and an open state or the switching between open states having different open angles) of the cover 25. In an embodiment, in case that the first link 61 is moved to the first movement distance at the first movement speed in the first direction (e.g., the +x-axis direction), the elastic structure of the second link 62 may allow a portion (e.g., the second support structure 82), connected to the third link 63, of the second link 62 to be moved to the second movement distance shorter than the first movement distance at the second movement speed slower than the first movement speed in the second direction (e.g., the +y-axis direction). In an embodiment, the second link 62 may include a shaft 70, a first support structure 81, a second support structure 82, a first elastic member 91, and/or a second elastic member 92.

According to an embodiment, the shaft 70 may be a rod shape, may have one end 71 and the other end 72, the extension direction from the one end to the other end being parallel to the second direction (e.g., the +y-axis direction) which is not parallel to the first direction (e.g., the +x-axis direction), and may transmit power in the second direction. In case that the first link 61 is moved to the first direction (e.g., the +x-axis direction), the shaft 70 may be moved in the second direction (e.g., the +y-axis direction) which is not parallel to the first direction. In an embodiment, the first link 61 may include a first inclined part 611, and the one end 71 of the shaft 70 may include a second inclined part 711 corresponding to the first inclined part 611. Due to the interaction by friction between the first inclined part 611 and the second inclined part 711, a first rectilinear motion (or a first translational motion), in which the first link 61 moves in the first direction, may be converted into a second rectilinear motion (or a second translational motion) in which the shaft 70 moves in the second direction. In an embodiment, the first inclined part 611 and the second inclined part 711 may have inclined surfaces which have the same inclination angle, correspond to each other, and thus are in contact with each other. By the interaction between the first inclined part 611 and the second inclined part 711 due to the inclination angle of the first inclined part 611 and the inclination angle of the second inclined part 711, the first rectilinear motion, in which the first link 61 moves in the first direction, may be converted into the second rectilinear motion in which the shaft 70 moves in the second direction. Since the first inclined part 611 and the second inclined part 711 have inclined surfaces which have the same inclination angle, correspond to each other, and thus are in contact with each other, it is possible to reduce the generation of frictional noise or generation of dust. In various embodiments (not shown), the first inclined part 611 may be implemented to have an end of the curved-surface shape to correspond to the second inclined part 711, or a structure on which a rotation member such as a roller is rotatably disposed. The interference between the first inclined part 611 and the second inclined part 711 may prevent and/or block the shaft 70 from being separated in a direction (e.g., the −y-axis direction) opposite to the second direction from the link structure 6. In various embodiments, in order to reduce a friction force between the first inclined part 611 and second inclined part 711, a lubricant agent (e.g., grease) may be interposed between the first inclined part 611 and the second inclined part 711. In various embodiments, in order to reduce a friction force between the first inclined part 611 and the second inclined part 711, the surface of the first inclined part 611 and/or the surface of the second inclined part 711 may be lubricated and thus coated.

According to various embodiments, it may also be possible to implement that the actuator 60 moves the shaft 70 of the second link 62 in the second direction (e.g., the +y-axis direction) without the first link 61.

According to an embodiment, the first support structure (or the first support member) 81 may be coupled to the first housing 211 (see FIG. 5) or be coupled to a bracket positioned inside the first housing 211. For another example, the first support structure 81 may be integrally provided with the first housing 211 or the bracket. In an embodiment, the first support structure 81 may include a first bottom part 811 and a first side wall part 812 coupled to the first housing 211 or the bracket. In an embodiment, the first bottom part 811 may include a plate (e.g., a first bottom plate) substantially parallel to the first direction (e.g., the +x-axis direction) and the second direction (e.g., the +y-axis direction). The first side wall part 812 may extend in a direction (e.g., the +z-axis direction) perpendicular to the first bottom part 811. The first side wall part 812 may be positioned between the plate 410 (see FIG. 4) of the first housing 211 and the first bottom part 811. The first side wall part 812 may include a first side wall 801, a second side wall 802, and/or a third side wall 803. The first side wall 801 may be perpendicular to the second direction (e.g., the +y-axis direction). The second side wall 802 may extend from one end of the first side wall 801, and the third side wall 803 may extend from the other end of the first side wall 801. The second side wall 802 and the third side wall 803 may be positioned at sides opposite to each other while having a spaced space therebetween, and may be parallel to the second direction (e.g., the +y-axis direction). The first support structure 81 may include a first space part 813 between the first bottom part 811 and the first side wall part 812.

According to an embodiment, the second support structure (or the second support member) 82 may be positioned in the first space part 813 of the first support structure 81. The second support structure 82 may be connected to the third link 63. In case that the second support structure 82 is moved from the first space part 813 in the second direction (e.g., the +y-axis direction), the third link 63 may cause the cover (see FIG. 5) to be opened with respect to the first opening 51 (see FIG. 5). The second support structure 82 may include a shape corresponding to the first space part 813 so that the second support structure is slidable substantially parallel to the second direction without shaking in the first space part 813. For example, the second support structure 82 may be subjected to a rectilinear motion or a translational motion parallel to the second direction. In an embodiment, the second support structure 82 may include a second bottom part 821 and a second side wall part 822 extending from the second bottom part 821. The second bottom part 821 may include a plate (e.g., a second bottom plate) which faces and is substantially parallel to the first bottom part 811 of the first support structure 81. The second side wall part 822 may include a fourth side wall 804, a fifth side wall 805, and/or a sixth side wall 806. The fourth side wall 804 may face and may be parallel to the first side wall 801 of the first support structure 81. The fifth wall 805 may extend from one end of the fourth side wall 804, and the sixth side wall 806 may extend from the other end of the fourth side wall 804. The fifth side wall 805 may face and may be parallel to the second side wall 802 of the first support structure 81. The sixth side wall 806 may face and may be parallel to the third side wall 803 of the first support structure 81. The second support structure 82 may include a second space part 823 between the second bottom part 821 and the second side wall part 822.

According to an embodiment, in order to reduce a friction force between the first support structure 81 and the second support structure 82, a lubricant agent (e.g., grease) may be interposed between the first support structure 81 and the second support structure 82. In various embodiments, in order to reduce a friction force between the first support structure 81 and the second support structure 82, the surface of the first support structure 81 and/or the surface of the second support structure 82 may be lubricated and thus coated. In various embodiments, in order to reduce a friction force between the first support structure 81 and the second support structure 82, a sliding structure using various rolling members such as a roller may be implemented between the first support structure 81 and the second support structure 82.

According to an embodiment, the second support structure 82 may include a first slider (or a first protruding part) S1 extending from the fifth side wall 805 in a direction (e.g., the +x-axis direction) perpendicular to the second direction and thus protruding with respect to the fifth side wall 805. The second support structure 82 may include a second slider (or a second protruding part) S2 extending from the sixth side wall 806 in another direction (e.g., the −x-axis direction) perpendicular to the second direction and thus protruding with respect to the sixth side wall 806. The first slider S1 and the second slider S2 may be aligned in a direction perpendicular to the second direction (e.g., the +x-axis direction). The first support structure 81 may include a first guide hole (e.g., a first slit) H1 provided through the second side wall 802 to correspond to the first slider S1. The first support structure 81 may include a second guide hole (e.g., a second slit) H2 provided through the third side wall 803 to correspond to the second slider S2. The first guide hole H1 and the second guide hole H2 may be provided to be symmetric to each other with reference to the shaft 70 or the center line E of the shaft 70. The first guide hole H1 and the second guide hole H2 may be provided to correspond to a movement path of the second support structure 82. The first slider S1 may be positioned in the first guide hole H1. The second slider S2 may be positioned in the second guide hole H2. The first guide hole H1 corresponding to the first slider S1 and the second guide hole H2 corresponding to the second slider S2 may contribute to that the second support structure 82 can be stably linearly moved with respect to the first support structure 81. The first slider S1 and the first guide hole H1, or the second slider S2 and the second guide hole H2 may limit the distance at which the second support structure 82 moves with respect to the first support structure 81. The first slider S1 and the first guide hole H1, or the second slider S2 and the second guide hole H2 may con-tribute to that the second support structure 82 is movable with respect to the first support structure 81 without being separated from the first support structure 81. In order to enable the first slider S1 to be positioned in the first guide hole H1 and enable the second slider S2 to be positioned in the second guide hole H2 in case that the first support structure 81 and the second support structure 82 are coupled to each other, the first support structure 81 may include an opening 817*a* extending from the first guide hole H1 and an opening 817*b* extending from the second guide hole H2.

According to various embodiments, the first slider S1 and the first guide hole H1 may contribute to preventing and/or reducing the second side wall 802 of the first support structure 81 and the fifth side wall 805 of the second support structure 82 from rubbing against each other, or reducing an area in which the second side wall and the fifth side wall rub against each other. The second slider S2 and the second guide hole H2 may contribute to preventing/reducing the third side wall 803 of the first support structure 81 and the sixth side wall 806 of the second support structure 82 from rubbing against each other, or reducing an area in which the second side wall and the fifth side wall rub against each other.

According to various embodiments, the first slider S1 and the first guide hole H1, or the second slider S2 and the second guide hole H2 may contribute to preventing/reducing the first bottom part 811 of the first support structure 81 and the second bottom part 821 of the second support structure 82 from rubbing against each other, or reducing an area in which the first bottom part of the first support structure and the second bottom part of the second support structure rub against each other.

According to various embodiments, in order to reduce a friction force between the first slider S1 and the first support structure 81 and a friction force between the second slider S2 and the first support structure 81, a lubricant agent (e.g., grease) may be interposed between the first slider S1 and the first support structure 81 and between the second slider S2 and the first support structure 81. In various embodiments, in order to reduce a friction force between the first slider S1 and the first support structure 81, the surface of the first slider S1 or the surface of the first guide hole H1 may be lubricated and coated. In various embodiments, in order to reduce a friction force between the second slider S2 and the first support structure 81, the surface of the second slider S2 or the surface of the second guide hole H2 may be lubricated and coated. In an embodiment, the first slider S1 may be provided in a shape (e.g., a circular cylinder shape) having a curved-surface part corresponding to the surface of the first guide hole H1 so as to reduce a friction force with the first support structure 81. The second slider S2 may be provided in a shape (e.g., a circular cylinder shape) having a curved-surface part corresponding to the surface of the second guide hole H2 so as to reduce a friction force with the first support structure 81. In various embodiments, in order to reduce a friction force between the first slider S1 and the first support structure 81, a rotation member, or a rolling member such as a roller or a bearing may be disposed on the first slider S1. In various embodiments, in order to reduce a friction force between the second slider S2 and the first support structure 81, a rotation member, or a rolling member such as a roller or a bearing may be disposed on the second slider S2.

According to an embodiment, the second slider S2 of the second support structure 82 may be connected to the third link 63. The link structure 6 may transmit power from the second link 62 to the third link 63 through the second slider S2.

According to an embodiment, the shaft 70 may be positioned across the second space part 823 of second support structure 82. The one end 71 of the shaft may protrude out of the second support structure 82 to correspond to the first inclined part 611 of the first link 61. The other end 72 of the shaft 70 may protrude out of the second support structure 82. For example, the fourth side wall 804 of the second support structure 82 may include a second notch 826 in which the shaft 70 is positioned. For example, the first side wall 801 of the first support structure 81 may include a first notch 816 in which the shaft 70 is positioned. The first notch 816 may be a space in which a second portion 720, extending through the first elastic member (e.g., a compression spring) 91 positioned in the first space part 813, of the shaft 70 is disposed in the first side wall 801. One end (not shown) of the first elastic member 91 may be supported by the first side wall 801 including the first notch 816. The second notch 826 may be a space in which the second portion 720, extending through the second elastic member (e.g., a compression spring) 92 positioned in the second space part 823, of the shaft 70 is disposed in the fourth side wall 804. One end (not shown) of the second elastic member 92 may be supported by the fourth side wall 804 including the second notch 826.

According to various embodiments, the one end (not shown) of the first elastic member 91 may be fixed to the first notch 816. For example, the one end of the first elastic member 91 may be inserted into the first notch 816 and thus fixed to the first notch 816. The structure, in which the one end of the first elastic member 91 is fixed to the first notch 816, may prevent and/or reduce the first elastic member 91 from moving excessively. In various embodiments, the one end (not shown) of the second elastic member 92 may be fixed to the second notch 826. For example, the one end of the second elastic member 92 may be inserted into the second notch 826 and thus fixed to the second notch 826. The structure, in which the one end of the second elastic member 92 is fixed to the second notch 826, may prevent and/or reduce the second elastic member 92 from moving excessively.

According to various embodiments, in place of the first notch 816 or the second notch 826, a through-hole, which allows the shaft 70 to extend therethrough and thus to be positioned therein, may also be provided.

According to an embodiment, in order to prevent and/or inhibit the shaft 70 from being separated from the second support structure 82 in the +z-axis direction, the second support structure 82 may include extension parts 827 (e.g., a separation prevention unit) extending from the fifth side wall 805 and/or sixth side wall 806 to cause interference with the shaft 70.

According to an embodiment, the shaft 70 may include a first portion 710 including the one end 71 and a second portion 720 including the other end 72. The second elastic member 92 may be positioned in the second space part 823 of the second support structure 82. The second elastic member 92 may be positioned between the first portion 710 of the shaft 70 and the fourth side wall 804 of the second support structure 82. For example, the second elastic member 92 may be a compression spring. The second portion 720 of the shaft 70 may be positioned through the second elastic member 92. For example, the second portion 720 of the shaft 70 may have a circular cylinder shape corresponding to the inner space of the second elastic member 92 implemented as a compression spring. In various embodiments, the second portion 720 of shaft 70 may be provided as a cylinder and may have various other cross-sectional shapes. The first portion 710 of the shaft 70 may include a shape at least partially corresponding to the second space part 823 so that the shaft is slidable substantially parallel to the second direction (e.g., the +y-axis direction) without shaking in the second space part 823 of the second support structure 820. For example, the shaft 70 may be subjected to a rectilinear motion or a translational motion parallel to the second direction. The first portion 710 of the shaft 70 may have a cross-sectional shape different from the second portion 720, and a step part 732 may be provided between the first portion 710 and the second portion 720. The step part 732 between the first portion 710 and the second portion 720 may function as a second support part for supporting one side of the second elastic member 92, and hereinafter, the step part 732 may be referred to as a 'second support part'. In an embodiment, the second elastic member 92 may exert a force for moving the shaft 70 in a direction (e.g., the −y-axis direction) opposite to the second direction with respect to the second support structure 82. In case that the second support structure 82 is moved in the second direction (e.g., the +y-axis direction) and thus the distance between the second support part 732 (or the first portion 710) of the shaft 70 and the fourth side wall 804 of the second support structure 82 is reduced, the second elastic member 92 may be compressed. In various embodiments, the second elastic member 92 is not limited to the compression spring, and may be implemented in various other forms. In various embodiments, the second elastic member 92 may be positioned between the second support part 732 of the shaft 70 and the fourth side wall 804 of the second support structure 82, and the second portion 720 of the shaft 70 may not extend through the second elastic member.

According to various embodiments, in order to reduce a friction force between the shaft 70 and the second support structure 82, a lubricant agent (e.g., grease) may be interposed between the first portion 710 of the shaft 70 and the second support structure 82. In an embodiment, in order to reduce a friction force between the shaft 70 and the second support structure 82, the surface of the first portion 710 and/or the surface of the second support structure 82 may be lubricated and thus coated. In an embodiment, in order to reduce a friction force between the shaft 70 and the second support structure 82, a sliding structure using various rolling members such as a roller may be implemented between the first portion 710 and the second support structure 82.

According to an embodiment, the second portion 720 of the shaft 70 may include a first support part 731 facing the fourth side wall 804 of the second support structure 82. The first support part 731 may be positioned between the first side wall 801 of the first support structure 81 and the fourth side wall 804 of the second support structure 82. The interference between the first support part 731 of the shaft 70 and the fourth side wall 804 of the second support structure 82 may prevent and/or inhibit the shaft 70 from moving in a direction (e.g., the −y-axis direction) opposite to the second direction. The first elastic member 91 may be positioned in the first space part 813 of the first support structure 81. The first elastic member 91 may be positioned between the first support part 731 of the shaft 70 and the first side wall 801 of the first support structure 81. For example, the first elastic member 91 may be a compression spring. The second portion 720 of the shaft 70 may be positioned through the first elastic member 91. In various embodiments, the first elastic member 91 is not limited to a compression spring, and may be implemented in various other forms. In various embodiments, the first elastic member 91 may be positioned between the first side wall 801 of the first support structure 81 and the fourth side wall 804 of the second support structure 82, and the second portion 720 of the shaft 70 may not extend through the first elastic member. The first elastic member 91 may exert a force for moving the second support structure 82 in a direction (e.g., the −y-axis direction) opposite to the second direction with respect to the first support structure 81. In case that the shaft 70 is moved in the second direction (e.g., the +y-axis direction) and thus the distance between the first support part 731 of the shaft 70 and the first side wall 801 of the first support structure 81 is reduced, the first elastic member 91 may be compressed. In various embodiments, a portion, which is positioned through the first elastic member 91, of the second portion 720 of the shaft may be omitted. In this case, the first notch 816 of the first support structure 81 may be omitted.

According to an embodiment, in case that the first slider S1 of the second support structure 82 is positioned at one end of the first guide hole H1 of the first support structure 81 and thus a state, in which the first slider interferes with the first support structure 81 and thus is no longer moved in a direction (e.g., the −y-axis direction) opposite to the second direction, is provided, the cover 25 may be in a closed state. The second slider S2 of the second support structure 82, which is connected to third link 63, may be in a state in which in a closed state of the cover 25, the second slider is positioned at one end of the second guide hole H2 of the first support structure 81 and thus interferes with the first support structure 81 so that the second slider is no longer moved in a direction opposite to the second direction. In various embodiments, the second slider S2 connected to the third link 63 may be in a state of not interfering with the first support structure 81 with respect to the movement in the direction opposite to the second direction, in a closed state of the cover 25.

According to various embodiments, in case that the second slider S2 connected to the third link 63 is positioned at one end of the second guide hole H2 and thus a state, in which the second slider interferes with the first support structure 81 and thus is no longer moved in a direction (e.g., the −y-axis direction) opposite to the second direction, is provided, the cover 25 may be in a closed state. In this case, the first slider S1 may be in a state of not interfering with the first support structure 81 with respect to the movement in a direction opposite to the second direction, in a closed state of the cover 25. In some cases, the first slider S1 and first guide hole H1 may be omitted.

According to an embodiment, the second support structure 82 may include a third guide hole (e.g., a third slit) H3 provided through the fifth side wall 805. The second support structure 82 may include a fourth guide hole (e.g., a fourth slit) H4 provided through the sixth side wall 806. The first portion 710 of the shaft 70 may include a third slider (or a third protruding part) S3 positioned in the third guide hole H3. The first portion 710 of the shaft 70 may include a fourth slider (or a fourth protruding part) S4 positioned in the fourth guide hole H4. The third guide hole H3 and the fourth guide hole H4, or the third slider S3 and the fourth slider S4 may be arranged symmetrically with reference to the center line E of the shaft 70. The third guide hole H3 and the fourth guide hole H4 may be provided to correspond to a movement path of the second support structure 82 with respect to the shaft 70. In case that a the force for reducing the distance between the first portion 710 of the shaft 70 and the fourth side wall 804 of the second support structure 82 does not act to correspond to the elasticity of the second elastic member 92, the third slider S3 of the shaft 70 may be positioned at one end of the third guide hole H3, and thus a state, in which the third slider interferes with the second support structure 82 and thus is no longer moved in a direction opposite to the second direction, may be provided. In case that a force for reducing the distance between the first portion 710 of the shaft 70 and the fourth side wall 804 of the second support structure 82 does not act to correspond to the elasticity of the second elastic member 92, the fourth slider S4 of the shaft 70 may be positioned at one end of the fourth guide hole H4, and thus a state, in which the fourth slider interferes with the second support structure 82 and thus is no longer moved in a direction opposite to the second direction, may be provided.

According to an embodiment, the second elastic member 92 may have an elastic force greater than the first elastic member 91. In case that the shaft 70 is moved in the second direction (e.g., the +y-axis direction), the first elastic member 91 may be compressed, and the second elastic member 92 having an elastic force greater than the first elastic member 91 may not be substantially compressed. In case that the shaft 70 is moved in the second direction, the second support structure 82 elastically supported by the shaft 70 using the second elastic member 92 may be moved in the second direction together with the shaft 70. The first slider S1 and the first guide hole H1, or the second slider S2 and the second guide hole H2 may limit the distance at which the second support structure 82 moves with respect to the first support structure 81, and may function to limit the elastic forces of the first elastic member 91 and the second elastic member 92, in case that the cover 25 is switched between an open state and a closed state or in case that the cover 25 is switched between open states having different open angles.

According to an embodiment, the hook structure 64 may include a first hook 641, a second hook 642, and/or a hook support part 643. The first hook 641 and the second hook 642 may extend from the hook support part 643. For example, the hook support part 643 may be provided in a ring shape (e.g., a rectangular ring shape) which allows the first support structure 81 to be inserted therethrough. The hook support part 643 may be coupled to the first support structure 81. In various embodiments, the hook support part 643 and first support structure 81 may be integrally provided. The first hook 641 and the second hook 642 may be symmetrically arranged with reference to the center line E of the shaft 70. In case that the distance between the first support part 731 of the shaft 70 and the first side wall 801 of the first support structure 81 is reduced and thus the second support structure 82 is moved in a direction (e.g., the −y-axis direction) opposite to the second direction in a state where the first elastic member 91 is compressed, the second elastic member 92 may be compressed. In an embodiment, in case that the cover is forcibly switched from an open state to a closed state by applying an external force to the cover 25 connected to the third link 63, the second slider S2 of the second support structure 82, which is connected to the third link 63, may be moved in a direction opposite to the second direction so that the second elastic member 92 is compressed. In case that the cover is forcibly switched from an open state to a closed state by applying an external force to the cover 25 connected to the third link 63, the first slider S1 or the second slider S2 of the second support structure 82 may be in a state of interfering with the first support structure 81 with respect to a movement in a direction opposite to the second direction. In case that the cover is forcibly switched from an open state to a closed state by applying an external force to the cover 25 connected to the third link 63, portions 901, at which the fifth side wall 805 of the second support structure 82 and the third slider S3 of the shaft 70 come into contact with each other, may be spaced apart from each other, and thus a recess-shaped first hook fastening part (e.g., see the first hook fastening part 1410 in FIG. 14) corresponding to the first hook 641 may be provided. The first hook 641 having one end connected to the hook support part 643 may be restored from a bent state such as a cantilever, and then be fastened to the first hook fastening part. In case that the cover is forcibly switched from an open state to a closed state by applying an external force to the cover 25 connected to the third link 63, portions 902, at which the sixth side wall 806 of the second support structure 82 and the fourth slider S4 of the shaft 70 come into contact with each other, may be spaced apart from each other, and thus a recess-shaped second hook fastening part (e.g., see the second hook fastening part 1420 in FIG. 14) corresponding to the second hook 642 may be provided. The second hook 642 having one end connected second hook support part 643 may be restored from a bent state such as a cantilever, and then be fastened to the second hook fastening part. The first support structure 81 may include a first penetrated part (or a first through-hole) 818 provided through the second side wall 802 to correspond to the first hook 641, and a second penetrated part (or a second through-hole) 819 provided through the third side wall 803 to correspond to the second hook 642. The first hook 641 may extend through the first penetrated part 818 and then be fastened to the first hook fastening part, and the second hook 642 may extend through the second penetrated part 819 and then be fastened to the second hook fastening part. The first hook 641 fastened to the first hook fastening part and the second hook 642 fastened to the second hook fastening part may prevent and/or reduce the second support structure 82 connected to the third link 63 from moving in the second direction (e.g., the +y-axis direction) so as to maintain the closed state of the cover 25. In various embodiments, one of the first hook 641 and the second hook 642 and one hook fastening part corresponding thereto may be omitted.

According to an embodiment, the third link 63 (e.g., a cover support structure) may be connected to the cover 25. For example, the third link 63 may include a foldable structure (or a seesaw structure) capable of a scissor action (e.g., contraction or elongation). The foldable structure may include multiple link elements and joints for connecting the multiple link elements. For example, the third link 63 may include a first link element 631, a second link element 632, and/or a third link element 633. The cover 25, in a closed state, may include a front surface 251 for providing the outer surface of the electronic device 2 and a rear surface 252 positioned at the side opposite to the front surface 251. For example, the front surface 251 may be substantially a flat surface. For another example, the front surface 251 may include a curved surface. The cover 25 may include a support part 253 having a shape of protruding from the rear surface 252. The first link element 631 may be coupled to the rear surface 252 of the cover 25. For example, the first link element 631 may include a bolt fastening hole 6311 for bolt fastening with the cover 25. One end of the second link element 632 may be connected to the first link element 631, and the other end of the second link element 632 may be connected to the support part 253 of the cover 25. In various embodiments, the first link element 631 and the second link element 632 may be integrally provided. The second element 632 may be disposed nonparallel to the front surface 251 of the cover 25. One end of the third link element 633 may be rotatably connected to the second link element 632 by means of a joint 1002 at a position between the one end and the other end of the second link element 632. The other end of the third link element 633 may be rotatably connected to the second slider S2 of the second support structure 82. The joint 1001 between the support part 253 and the second link element 632 may be rotatably connected (or fixed) to the first support structure 81.

In case that the second support structure 82 including the second slider S2 is moved in the second direction (e.g., the +y-axis direction), the cover 25 may be switched from a closed state to an open state by a scissor action between the second link element 632 and the third link element 633.

According to an embodiment, elements included in the link structure 6 may be implemented with a material (e.g., metal or engineering plastic) having rigidity or durability for preventing/reducing the elements from being substantially deformed by a force acting at the time of a state change (e.g., the switching between a closed state and an open state) of the cover 25. Due to this, it is possible to reduce loss of the motion transmitted between elements in a state change of the cover 25.

According to an embodiment, the link structure 6 may include another second link 65, another third link 66, and/or another hook structure 67 which are included the portion indicated by reference numeral 'D' illustrated in FIG. 6. Another second link 65 may be connected to be driven to the first link 61, and may be implemented substantially symmetrically with the second link 62 included in the portion indicated by reference numeral 'C' with reference to the first link 61. Another third link 66 may be connected to be driven to another second link and the cover 25, and may be implemented substantially symmetrically with the third link 63 included in the portion indicated by reference numeral 'C' with reference to the first link 61. Another hook structure 67 may be implemented substantially symmetrically with the hook structure 64 included in the portion indicated by reference numeral 'C' with reference to the first link 61. Since the second link 62 and the third link 63 included in the portion indicated by reference numeral 'C' applies a force to one side of the cover 25, and another link and another third link included in the portion indicated by reference numeral 'D' applies a force to the other side of the cover 25, the cover 25 may be stably opened or closed. In various embodiments, another link and another third link included in the portion indicated by reference numeral 'D' may be omitted from the link structure 6, and multiple link structures 6 each including the first link 61, the second link 62, the third link 63, and the actuator 60 may be implemented therein.

Figure 11:
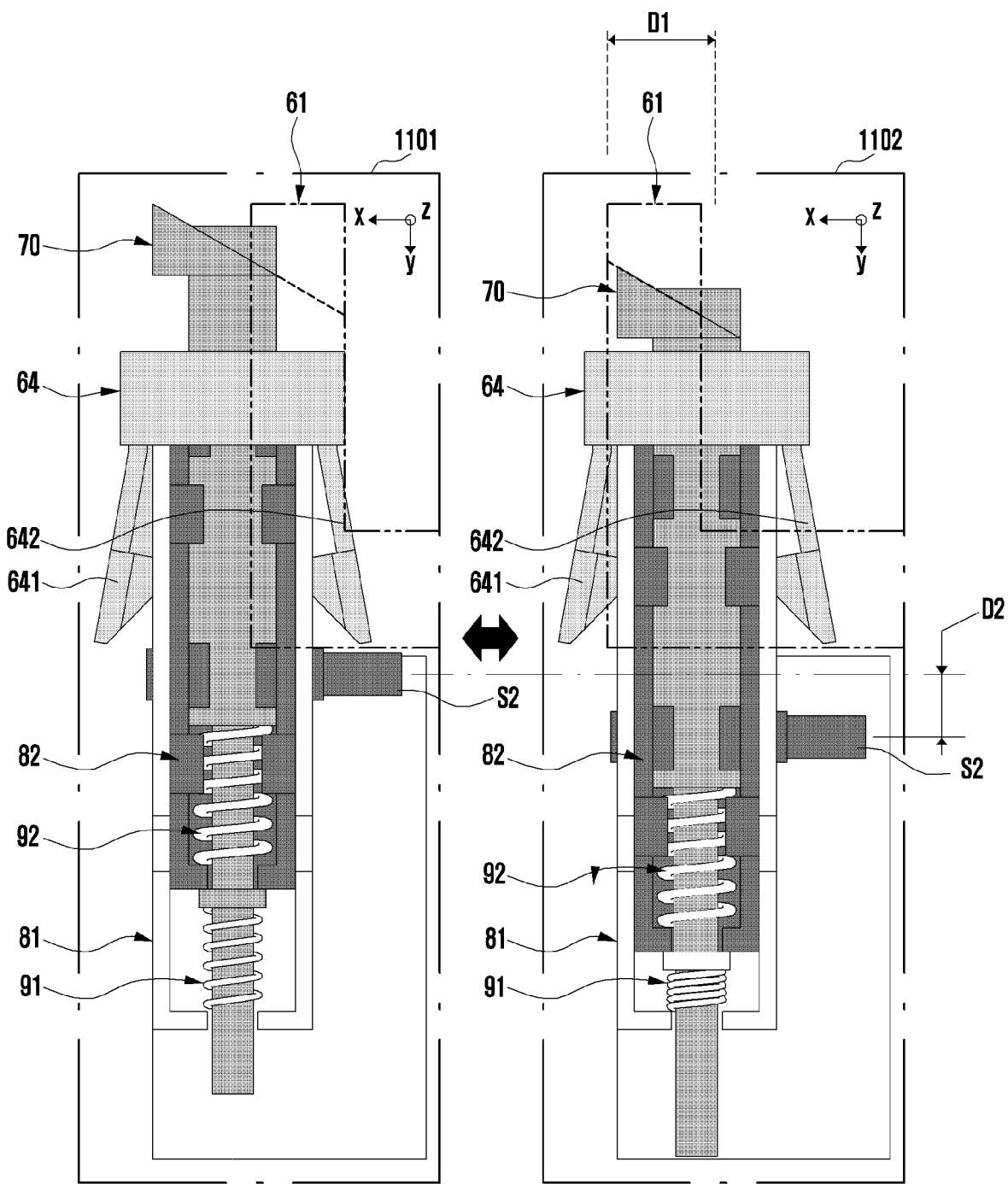
FIG. 11 is a diagram illustrating plan view of a part of a link structure in a state change of a cover according to various embodiments.
Figure 12:
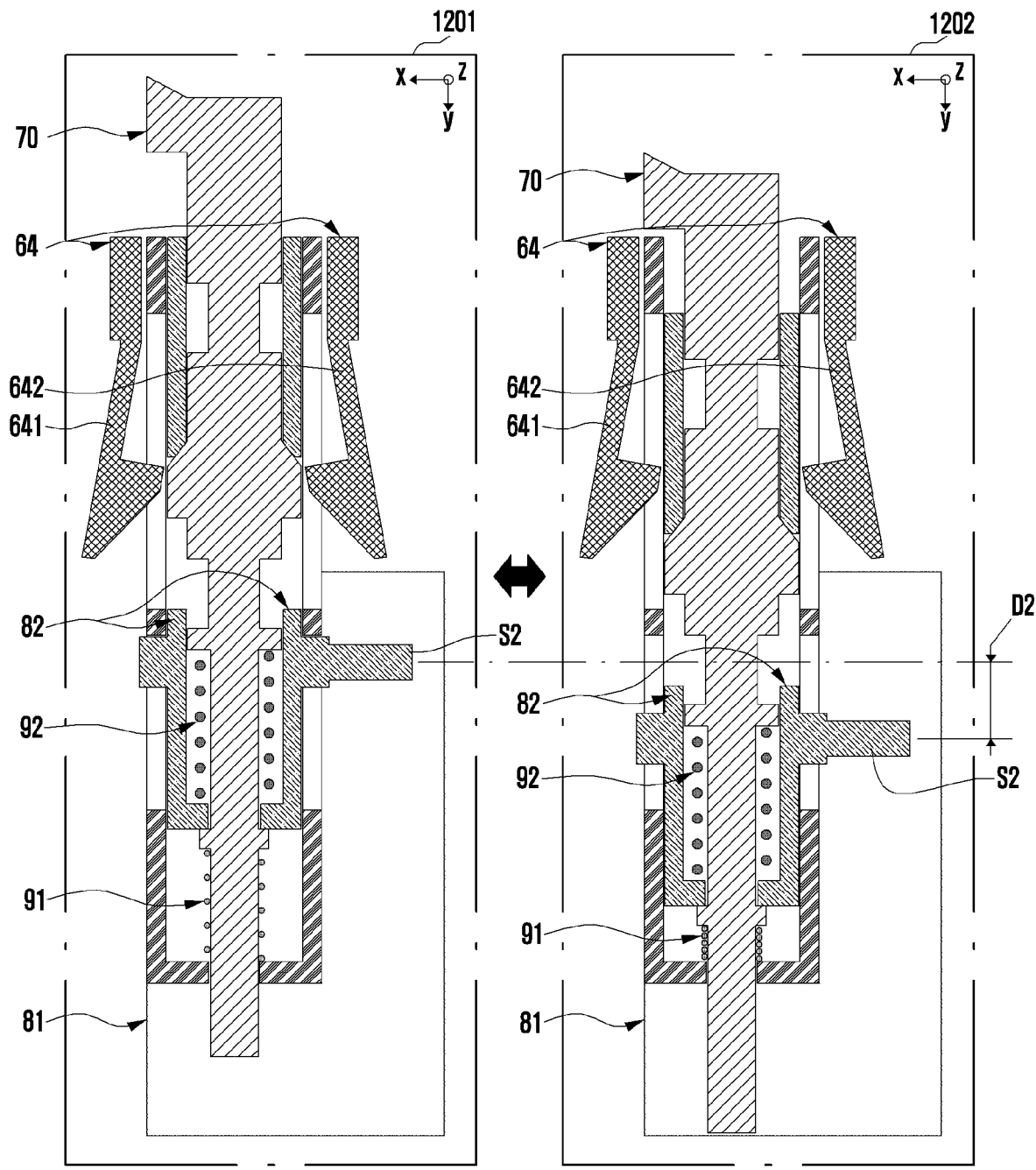
FIG. 12 is a cross-sectional view of a part of a link structure in a state change of a cover according to various embodiments.
Figure 13:
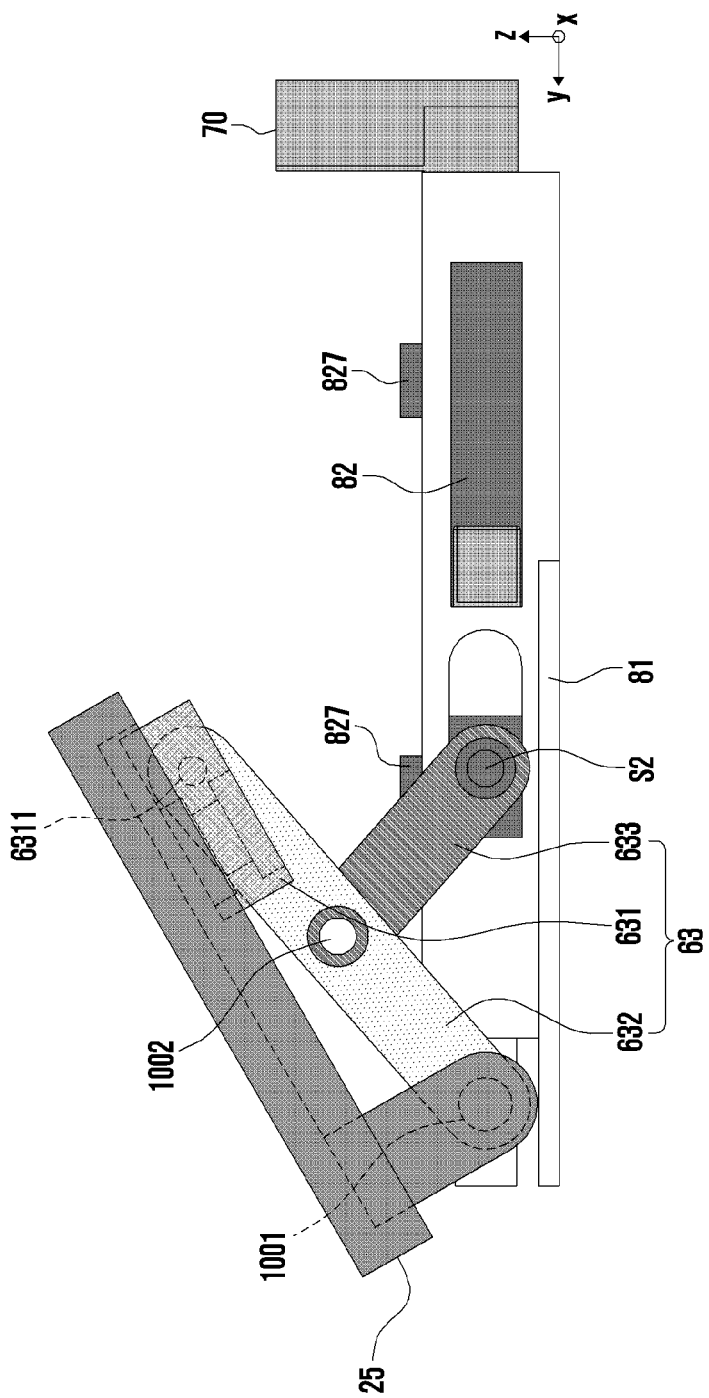
FIG. 13 is a diagram illustrating a side view of a part of a link structure in an open state of a cover according to various embodiments.

FIG. 11 is a diagram illustrating a plan view of a part of a link structure 6 in a state change of a cover 25 (see FIG. 4 or FIG. 5) according to various embodiments. FIG. 12 is a cross-sectional view of a part of a link structure 6 in a state change of a cover 25 according to various embodiments. FIG. 13 is a diagram illustrating a side view of a part of a link structure 6 in an open state of a cover 25 according to various embodiments.

Referring to FIG. 11, the portion indicated by reference numeral '1101' is a plan view of a part of the link structure 6 in a closed state of the cover 25, and the portion indicated by reference numeral '1102' is a plan view of a part of the link structure 6 in an open state of the cover 25. Referring to FIG. 12, the portion indicated by reference numeral '1201' is a cross-sectional structure of a part of the link structure 6 in a closed state of the cover 25, and the portion indicated by reference numeral '1202' is a cross-sectional structure of a part of the link structure 6 in an open state of the cover 25.

For example, an operation in which the link structure 6 switches the cover 25 from a closed state to an open state may be as follows. The first link 61 may be moved to a first movement distance D1 in the first direction (e.g., the +x-axis direction) by the power transmitted from the actuator 60 (see FIG. 6). The shaft 70 may be moved to a second movement distance D2 in the second direction (e.g., the +y-axis direction) different from the first direction by the interaction between the first link 61 and shaft 70. The second elastic member 92 (e.g., a second compression spring) between the shaft 70 and the second support structure 82 may have an elastic force greater than the first elastic member 91 (e.g., a first compression spring) between the second support structure 82 and the first support structure 81. The second support structure 82 may be elastically supported by the second elastic member 92 between the shaft 70 and the second support structure 82, and thus be moved to the second movement distance D2 in the second direction. The first elastic member 91 may be compressed, and since the second elastic member 92 has an elastic force greater than the first elastic member 91, the second elastic member may not be substantially compressed. The second slider S2 of the second support structure 82, which is connected to the third link 63, may be moved to the second movement distance D2 in the second direction, and the cover 25 may be switched from a closed state to an open state by the interaction between the cover 25 and the third link 63. In an embodiment, the third link 63 may transmit power in a third direction (e.g., the +z-axis direction) perpendicular to both the first direction and the second direction, and thus may switch the cover 25 from a closed state to an open state. The illustrated example may be an open state (e.g., a fully open state) in which the cover 25 is opened at a maximum angle. Although not illustrated herein, according to the first movement distance D1 at which the first link 61 is moved in the first direction, the second movement distance D2, at which the second support structure 82 including the second slider S2 is moved in the second direction, may be changed, and accordingly, the open angle of the cover 25 may be various. The compressed states of the first elastic member 91 may be different according to the open angles of the cover 25. For example, in case that the open angle of the cover 25 is a maximum angle, the compression ratio or the compression force of the first elastic member 91 may be maximized/increased. As the first elastic member 91 starts to be compressed, the open angle of the cover 25 may increase. According to the first movement speed at which the first link 61 is moved in the first direction, the second movement speed, at which the second support structure 82 including the second slider S2 is moved in the second direction, may be changed, and accordingly, the speed at which the cover 25 is opened may be various.

For example, an operation in which the link structure 6 switches the cover 25 from an open state to a closed state may be as follows. The shaft 70 may be moved to the second movement distance D2 in a direction (e.g., the −y-axis direction) opposite to the second direction. The first link 61 may be moved to the first movement distance D1 in a direction (e.g., the −x-axis direction) opposite to the first direction by the interaction between the first link 61 and shaft 70. The second support structure 82 may be moved to the second movement distance D2 in a direction opposite to the second direction in a state of being supported by the shaft 70. The restoring force (or an elastic force) that the first elastic member 91 tries to restore from a compressed state to a non-compression state may be applied to the movement of the shaft 70 and the second support structure 82. The second slider S2 of the second support structure 82, which is connected to the third link 63, may be moved to the second movement distance D2 in a direction opposite to the second direction, and the cover 25 may be switched from an open state to a closed state by the interaction between the cover 25 and the third link 63. The first elastic member 91 in a closed state of cover 25 may be in a state which is less compressed than when the cover 25 is in an open state or is substantially uncompressed. While the cover 25 is switched form an open state to a closed state, power output from the actuator 60 (see FIG. 6) may not substantially exist, or may have a size which enables the first elastic member 91 to be restored. According to a size of the power output from the actuator 60, the speed at which the cover 25 is closed may be various.

Figure 14:
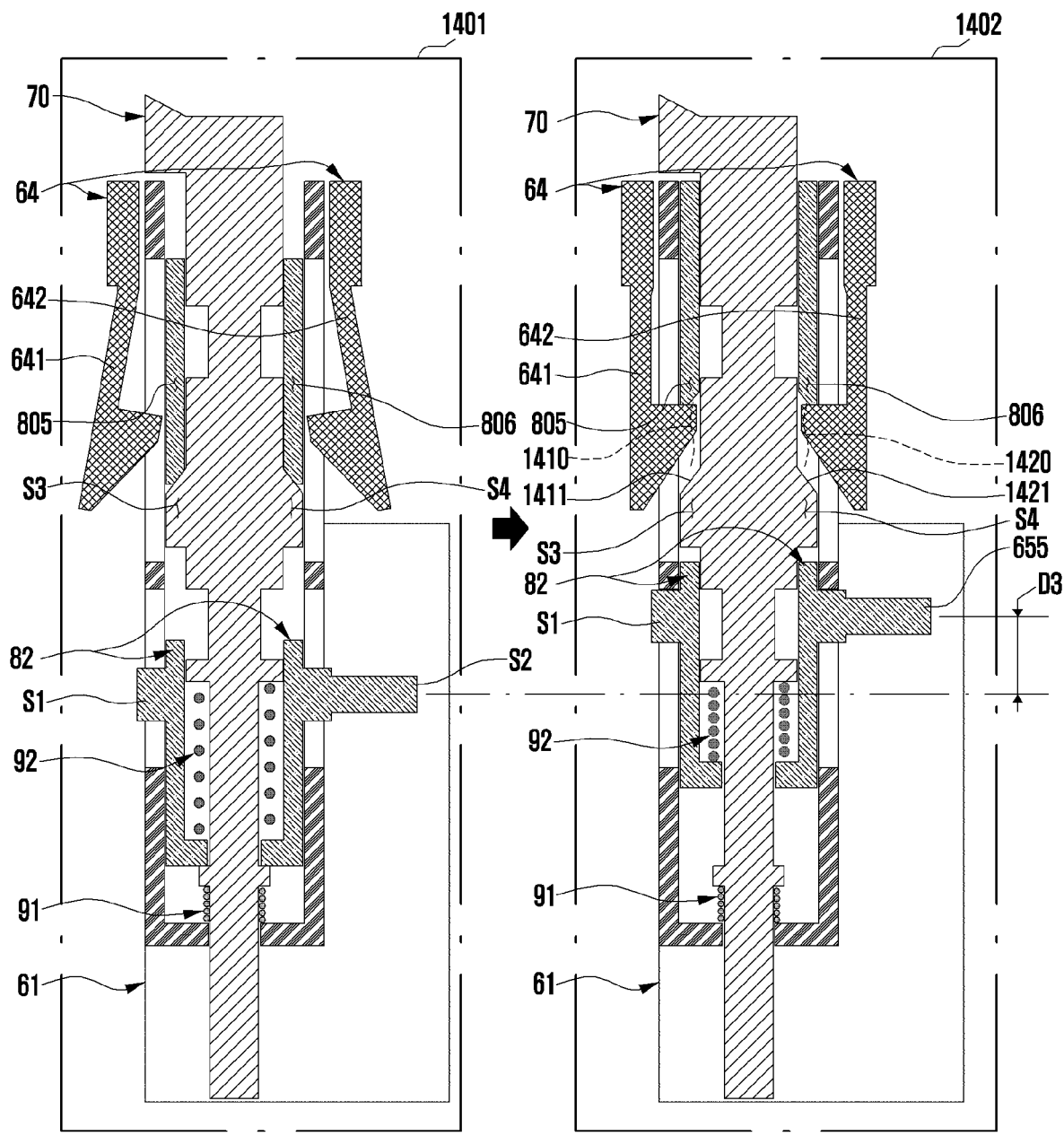
FIG. 14 is a cross-sectional view of a part of a link structure when a cover is forcibly switched from an open state to a closed state according to various embodiments.
Figure 15:
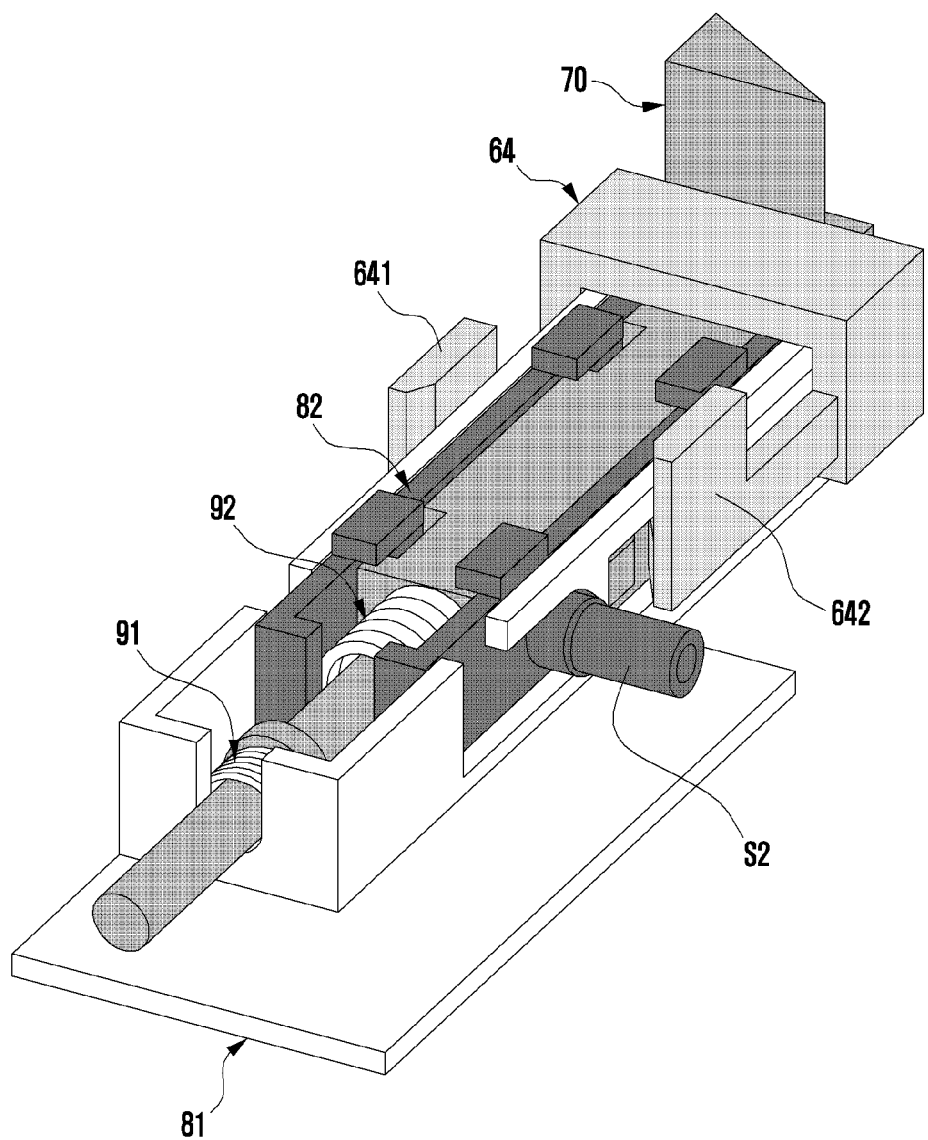
FIG. 15 is a perspective view illustrating a part of a link structure in a state in which a cover is forcibly closed according to various embodiments.

In an embodiment, FIG. 14 is a cross-sectional view of a part of a link structure 6 when a cover 25 (see FIG. 4 or 5) is forcibly switched from an open state to a closed state according to various embodiments. FIG. 15 is a perspective view illustrating a part of a link structure 6 in a state in which a cover 25 forcibly closed according to various embodiments.

Referring to FIG. 14, the portion indicated by reference numeral '1401' is a cross-sectional view of a part of a link structure 6 in an open state (e.g., a fully open state) in which a cover 25 is opened at a maximum angle, and the portion indicated by reference numeral '1402' is a cross-sectional view of a part of a link structure 6 in a state in which the cover 25 is forcibly closed. In an embodiment, the cover 25 may be forcibly closed by applying an external force to the cover 25. For example, in case that the electronic device 2 (see FIG. 2) is switched from an unfolded state to a closed state, the cover 25 may be forcibly closed by the second housing 212. Although the illustrated example shows that the cover 25 is forcibly switched from a fully open state to a closed state, the cover 25 may also be forcibly switched from an open state having an open angle smaller than a fully open state to a closed state. In case that the cover 25 is forcibly switched from an open state having an open angle smaller than a fully open angle smaller than a fully open state to a closed state, the cover may be driven in substantially the same manner as the case that the cover 25 is forcibly switched from a fully open state to a closed state, only differing in the degree of compression of the first elastic member 91. In an embodiment, in case that the cover 25 is forcibly switched from an open state to a closed state by an external force, the second support structure 82 including the second slider S2 connected to the cover may be moved to a third movement distance D3 in a direction (e.g., the −y-axis direction) opposite to the second direction. In an embodiment, the third movement distance D3 may be substantially the same as the second movement distance D2 in FIG. 11. In various embodiments, the third movement distance D3 may be different from the second movement distance D2 in FIG. 11. The second elastic member 92 (e.g., a second compression spring) between the shaft 70 and the second support structure 82 may be compressed. In case that the cover 25 is forcibly switched from an open state to a closed state by an external force, the first slider S1 or the second slider S2 of the second support structure 82 may be in a state of interfering with the first support structure 81 with respect to a movement in a direction opposite to the second direction.

According to an embodiment, in case that the cover 25 connected to the third link 63 is forcibly switched from an open state to a closed state by applying an external force thereto, portions, at which the fifth side wall 805 of the second support structure 82 and the third slider S3 of the shaft 70 come into contact with each other, may be spaced apart from each other, and thus a recess-shaped first hook fastening part 1410 corresponding to the first hook 641 may be provided. The first hook 641 may be restored from a bent state such as a cantilever, and then be fastened to the first hook fastening part 1410. According to an embodiment, in case that the cover 25 connected to the third link 63 is forcibly switched from an open state to a closed state by applying an external force thereto, portions, at which the sixth side wall 806 of the second support structure 82 and the fourth slider S4 of the shaft 70 come into contact with each other, may be spaced apart from each other, and thus a recess-shaped second hook fastening part 1420 corresponding to the second hook 642 may be provided. The second hook 642 may be restored from a bent state such as a cantilever, and then be fastened to the second hook fastening part 1420. The first hook 641 fastened to the first hook fastening part 1410 and the second hook 642 fastened to the second hook fastening part 1420 may prevent and/or inhibit the second support structure 82 from being moved in the second direction (e.g., the +y-axis direction) in response to the elastic force of the second elastic member 92 in a compressed state, and thus, the closed state of the cover 25 may be maintained.

In an embodiment, for example, an operation, in which the link structure 6 is switched from the state of the cross-section structure indicated by reference numeral '1401' in FIG. 14 to the state of the cross-section structure indicated by reference numeral '1201' in FIG. 12, may be as follows. In case that the electronic device 2 (see FIG. 2) is switched an unfolded state to a folded state, the amount of heat emitted from at least one component in the first housing 211 may be reduced. For example, in case that the electronic device 2 is switched an unfolded state to a folded state, the electronic device 2 may be implemented in a low power mode or a sleep mode, and thus at least one component may not be used or the amount of a current consumed in at least one component may be smaller compared to an unfolded state. Therefore, in case that the electronic device 2 is switched an unfolded state to a folded state, the temperature detected inside the first housing 211 or the amount of heat emitted from at least one component in the first housing 211 may be reduced below a threshold value. In this case, power output from the actuator 60 (see FIG. 6) may not substantially exist, or may have a size which enables the first elastic member 91 to be restored, and thus, the shaft 70 may be moved in a direction (e.g., the −y-axis direction) opposite to the second direction by the elastic force of the first elastic member 91. In case that the shaft 70 is moved in a direction opposite to the second direction by the elastic force of the first elastic member 91, the second elastic member 92 between the shaft 70 and the second support structure 82 may be restored to the state of the cross-sectional structure indicated by reference numeral '1201' in FIG. 12. The third slider S3 of the shaft 70 may include a first inclined surface 1411, and the fourth slider S4 of the shaft 70 may include a second inclined surface 1421. In case that the shaft 70 is moved in a direction opposite to the second direction by the elastic force of the first elastic member 91, the first hook 641 may be bent to correspond to the first inclined surface 1411 of the third slider S3, the second hook 642 may be bent to correspond to the second inclined surface 1421 of the fourth slider S4 of the shaft 70, and thus the first hook 641 and the second hook 642 may be arranged in the state of the cross-sectional structure indicated by reference numeral '1201' in FIG. 12.

Figure 16:
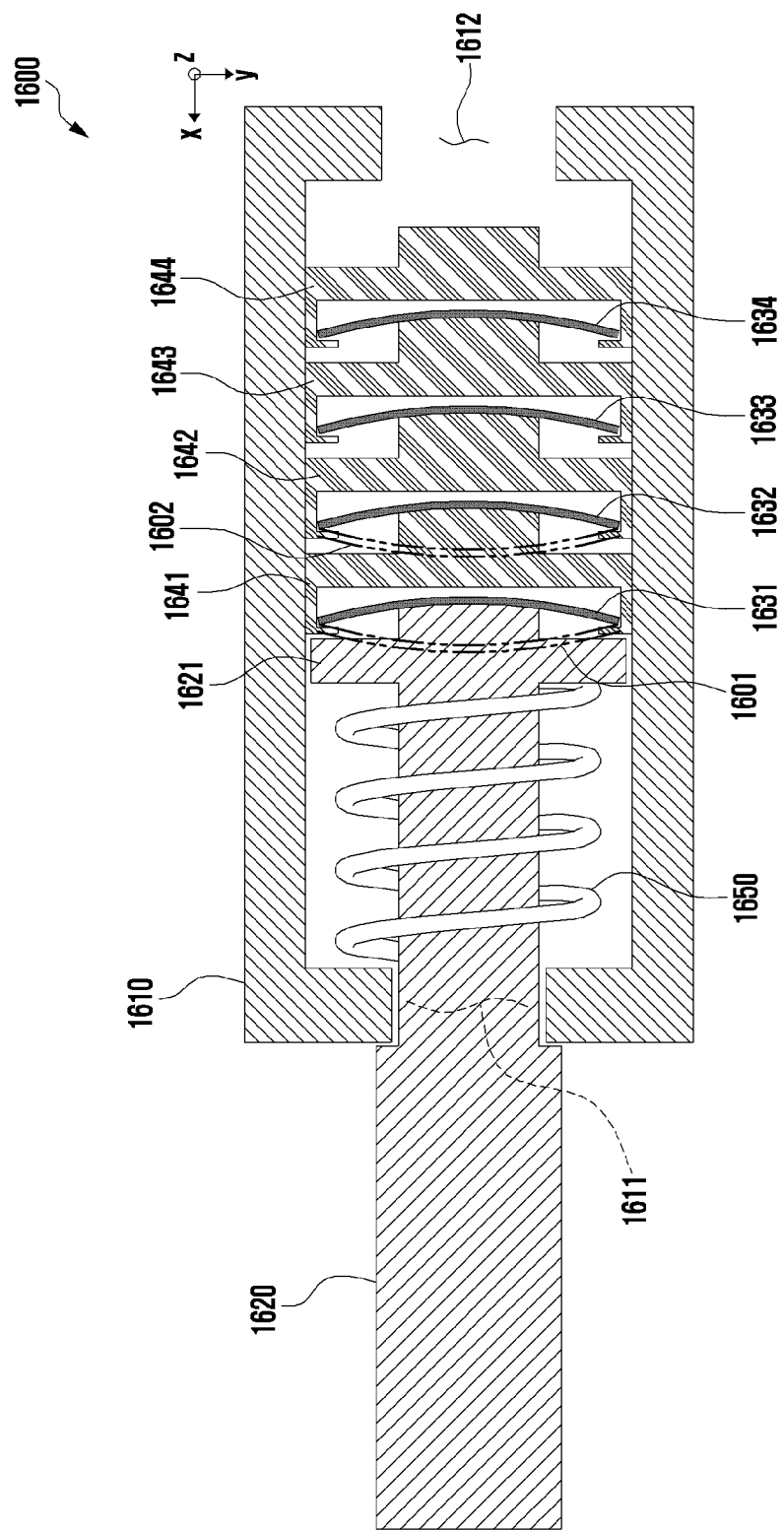
FIG. 16 is a partial cross-sectional view of the actuator in FIG. 6 according to various embodiments.

FIG. 16 is a partial cross-sectional view 1600 of an actuator 60 in FIG. 6 according to various embodiments.

Referring to FIG. 16, in an embodiment, the actuator 60 may output power transmitted to the first link 61 (see FIG. 6) using a bimetal deformed in response to a temperature. For example, the actuator 60 may include a housing 1610, a shaft 1620, multiple bimetals 1631, 1632, 1633, and 1634, multiple support members 1641, 1642, 1643, and 1644, and/or an elastic member 1650. The multiple bimetals 1631, 1632, 1633, and 1634, the multiple support members 1641, 1642, 1643, and 1644, and/or the elastic member 1650 may be positioned in the housing 1610. The shaft 1620 may be an element for transmitting power to the first link 61 (see FIG. 6), and may be positioned through a first opening 1611 of the housing 1610. One end of the shaft 1620 may be positioned outside the housing 1610, and the other end of the shaft 1620 may be positioned inside the housing 1610. The elastic member 1650 may elastically support the shaft 1620 in a direction (e.g., the −x-axis direction) opposite to the first direction with respect to the housing 1610. For example, the elastic member 1650 may include a compression spring, and the shaft 1620 may be positioned through the elastic member 1650. The elastic member 1650 may be positioned between an inner wall of the housing 1610 and a support part 1621 provided at the end of the shaft 1620. For example, each of the multiple bimetals 1631, 1632, 1633, and 1634 may be a form in which two types of thin metal plates having thermal expansion coefficients (e.g., degrees of expansion or contraction according to a temperature change) different from each other are stacked and then attached to each other. The multiple bimetals 1631, 1632, 1633, and 1634 may react with heat above a designated temperature and thus be deformed, and be restored to the original state thereof in heat below the designated temperature. The multiple bimetals 1631, 1632, 1633, and 1634 may be arranged in the first direction (e.g., the +x-axis direction). The multiple bimetals 1631, 1632, 1633, and 1634 may be arranged in multiple support members 1641, 1642, 1643, and 1644, respectively. The multiple support members 1641, 1642, 1643, and 1644 may be positioned inside the housing 1610 to be movable in the first direction. The shaft 1620 may be positioned to be in contact with the first bimetal 1631. The second bimetal 1632 may be disposed to be in contact with the first support member 1641 in which the first bimetal 1631 is disposed. The third bimetal 1633 may be disposed to be in contact with the second support member 1642 in which the second bimetal 1632 is disposed. The fourth bimetal 1634 may be disposed to be in contact with the third support member 1643 in which the third bimetal 1633 is disposed. Due to at least one bimetal among the multiple bimetals 1631, 1632, 1633, and 1634, which reacts with heat and thus is deformed, a movement distance and/or a movement speed of the shaft 1620 connected to the first link 61 may be various. For example, in case that the first bimetal 1631 is deformed by heat as the imaginary line (alternate long and two short dashes line) indicated by reference numeral '1601', the first bimetal 1631 may press the shaft 1620 in the first direction, and the shaft 1620 may be moved to a first displacement corresponding to the deformation of the first bimetal 1631, in the first direction. For example, in case that the second bimetal 1632 is deformed by heat as the imaginary line (alternate long and two short dashes line) indicated by reference numeral '1602', the second bimetal 1632 may press the first support member 1641 in which the first bimetal 1631 is disposed, in the first direction, and the shaft 1620 may be moved to a displacement corresponding to the deformation of the second bimetal 1632, in the first direction. In the same manner, in case that the third bimetal 1633 reacts with heat and thus is deformed, the deformed third bimetal 1633 may press the second support member 1642 in the first direction, and the shaft 1620 may be moved to a displacement corresponding to the deformation of the third bimetal 1633, in the first direction. In the same manner, in case that the fourth bimetal 1634 reacts with heat and thus is deformed, the deformed fourth bimetal 1634 may press the third support member 1643 in the first direction, and the shaft 1620 may be moved to a displacement corresponding to the deformation of the fourth bimetal 1634, in the first direction. The numbers of the bimetals and the support members in which the bimetals are arranged is not limited to the illustrated example, and may be various. In various embodiments, the elastic member 1650 may be omitted.

According to an embodiment, one among the multiple bimetals 1631, 1632, 1633, and 1634 may react with heat above a first temperature and thus be deformed, and another among the multiple bimetals 1631, 1632, 1633, and 1634 may react with heat having a second temperature or higher, which is different from the first temperature, and thus be deformed.

According to an embodiment, the first displacement, in which one among the multiple bimetals 1631, 1632, 1633, and 1634 reacts with heat and thus is deformed the first direction (e.g., the +x-axis direction), may be substantially the same as a second displacement in which another among the multiple bimetals 1631, 1632, 1633, and 1634 reacts with heat and thus is deformed in the first direction. In various embodiments, the first displacement and the second displacement may be different.

Although the disclosure explains the heat dissipation structure used in a laptop computer as an example, the heat dissipation structure according to an embodiment of the disclosure can be applied to various other types of electronic devices.

According to an example embodiment of the disclosure, an electronic device (e.g., the electronic device 2 in FIG. 2) may include: a housing (e.g., the first housing 211 in FIG. 2) including an opening (e.g., the first opening 51 in FIG. 2). The electronic device may include a cover (e.g., the cover 25 in FIG. 2) configured to open or close the opening. The electronic device may include a link structure (e.g., the link structure 6 in FIG. 6) connected to the cover, and the link structure may be positioned inside the housing. The link structure may include an actuator (e.g., the actuator 60 in FIG. 6) configured to output power based on a temperature detected inside the housing. The link structure may include a first link (e.g., the first link 61 in FIG. 6) configured to move in a first direction by the power. The link structure may include a second link (e.g., the second link 62 in FIG. 6). The second link may be configured to transmit the power in a second direction perpendicular to the first direction in response to a movement of the first link. The second link may include an elastic structure including a first spring (e.g., the first spring 91 in FIG. 7) and a second spring (e.g., the second spring 92 in FIG. 7) each of the first and second springs having different elastic forces. The link structure may include a third link (e.g., the third link 63 in FIG. 6). The third link may be configured to connect the second link and the cover. The third link may be configured to transmit the power in a third direction perpendicular to the first direction and the second direction to switch the cover from a closed state to an open state.

According to an example embodiment, the actuator (e.g., the actuator 60 in FIG. 6) may include a bimetal configured to be deformed in response to a temperature detected inside the housing (e.g., the first housing 211 in FIG. 2), or may be electrically connected to a temperature sensor (e.g., the sensor module 176 in FIG. 1) disposed in the housing (e.g., the first housing 211 in FIG. 2) and configured to detect a temperature. For example, the actuator may be configured to output power, based on a signal from the temperature sensor (e.g., the sensor module 176 in FIG. 1).

According to an example embodiment of the disclosure, the second link (e.g., the second link 62 in FIG. 6) may include a first support (e.g., the first support structure 81 in FIG. 8) disposed in the housing (e.g., the first housing 211 in FIG. 5) or integrally provided with the housing. The second link may include a second support (e.g., the second support structure 82 in FIG. 8) positioned in a first space part (e.g., the first space part 813 in FIG. 8) of the first support. The second support may be configured to be slidable in parallel to the second direction with respect to the first support. The second support may be connected to the third link (e.g., the third link 63 in FIG. 8). The second link may include a shaft (e.g., the shaft 70 in FIG. 8) positioned across a second space part (e.g., the second space part 823 in FIG. 8) of the second support. The shaft may be configured to extend from one end (e.g., the one end 71 in FIG. 8) corresponding to the first link to the other end (e.g., the other end 72 in FIG. 8) thereof. The shaft may be configured to be slidable in parallel to the second direction with respect to the second support. The first spring may be positioned in the first space part while being penetrated by the shaft. The first spring may be positioned between a first support part (e.g., the first support part 731 in FIG. 7) provided on a portion of the shaft and a side wall (e.g., the first side wall 801 in FIG. 7) of the first support, the portion being provided outside the second support structure, the side wall facing and being spaced apart from the first support part. The second spring may be positioned in the second space part while being penetrated by the shaft. The second spring may be positioned between a second space part (e.g., the second support part 732 in FIG. 7) provided on the shaft and a side wall (e.g., the fourth side 804 in FIG. 7) of the second support structure, which faces and is spaced apart from the second support part.

According to an example embodiment of the disclosure, the second spring (e.g., the second spring 92 in FIG. 11) may have an elastic force greater than an elastic force of the first spring (e.g., the first spring 91 in FIG. 11). Based on the first link (e.g., the first link 61 in FIG. 11) being moved in the first direction (e.g., the +x-axis direction in FIG. 11), the shaft (e.g., the shaft 70 in FIG. 11) may be configured to be moved in the second direction (e.g., the +y-axis direction in FIG. 11). Based on the shaft being moved in the second direction, the first spring may be configured to be compressed, and the second spring may be configured to not be compressed or be less compressed than the first spring.

According to an example embodiment of the disclosure based on the shaft (e.g., the shaft 70 in FIG. 11) being moved in the second direction (e.g., the +y-axis direction in FIG. 11), the second support (e.g., the second support structure 82 in FIG. 11) may be configured to be moved in the second direction together with the shaft in a state of being supported by the second spring (e.g., the second spring 92 in FIG. 11). Based on the second support being moved in the second direction, the third link (e.g., the third link 63 in FIG. 13) may be configured to switch the cover (e.g., the cover 25 in FIG. 13) from the closed state to the open state.

According to an example embodiment of the disclosure, based on the cover (e.g., the cover 25 in FIG. 13) being forcibly switched from the open state to the closed state by an external force, the second support (e.g., the second support structure 82 in FIG. 14) connected to the third link (e.g., the third link 63 in FIG. 13) may be configured to be moved in a direction opposite to the second direction (e.g., the −y-axis direction in FIG. 14), to compress the second spring (e.g., the second spring 92 in FIG. 14).

According to an example embodiment of the disclosure, the link structure (e.g., the link structure 6 in FIG. 6) may include at least one hook (e.g., the first hook 641 or the second hook 642 in FIG. 14) configured to interfere with the second support (e.g., the second support structure 82 in FIG. 14) to prevent and/or inhibit the second support from being moved in the second direction (e.g., the +y-axis direction in FIG. 14) based on the cover being forcibly switched from the open state to the closed state.

According to an example embodiment of the disclosure, the housing may include a foldable housing (e.g., the foldable housing 21 in FIG. 2). Based on the foldable housing being switched from an unfolded state to a folded state, the cover (e.g., the cover 25 in FIG. 4) may be configured to be forcibly switched from the open state to the closed state.

According to an example embodiment of the disclosure, the electronic device (e.g., the electronic device 2 in FIG. 2) may include a laptop computer.

According to an example embodiment of the disclosure, one end (e.g., the one end 71 in FIG. 7) of the shaft (e.g., the shaft 70 in FIG. 7) may include a second inclined part (e.g., the second inclined part 711 in FIG. 7) configured to rub against a first inclined part (e.g., the first inclined part 611 in FIG. 7) of the first link (e.g., the first link 61 in FIG. 7).

According to an example embodiment of the disclosure, the third link (e.g., the third link 63 in FIG. 10) may be configured to be foldable in a scissor action.

According to an example embodiment of the disclosure, the actuator (e.g., the actuator 60 in FIG. 6) may be configured to output power based on a temperature detected inside the housing (e.g., the first housing 211 in FIG. 5) being greater than or equal to a threshold value.

According to an example embodiment of the disclosure, the actuator (e.g., the actuator 60 in FIG. 6) may include at least one bimetal (e.g., the multiple bimetals 1631, 1632, 1633, and 1634 in FIG. 16) configured to be displaced in the first direction (e.g., the +x-axis direction in FIG. 6) based on heat having a designated temperature or more.

According to an example embodiment of the disclosure, the actuator (e.g., the actuator 60 in FIG. 6) may include a motor controlled by at least one processor (e.g., the processor 120 in FIG. 1) included in the electronic device.

According to an example embodiment of the disclosure, the actuator (e.g., the actuator 60 in FIG. 6) may include a solenoid controlled by at least one processor (e.g., the processor 120 in FIG. 1) included in the electronic device.

According to an example embodiment of the disclosure, the opening (e.g., the first opening 51 in FIG. 5) may include an air suction hole.

According to an example embodiment of the disclosure, an electronic device (e.g., the electronic device 2 in FIG. 2) may include a housing (e.g., the first housing 211 in FIG. 2) including an opening (e.g., the first opening 51 in FIG. 2). The electronic device may include a cover (e.g., the cover 25 in FIG. 2) configured to open or close the opening. The electronic device may include a link structure (e.g., the link structure 6 in FIG. 6) connected to the cover, and the link structure may be positioned inside the housing. The link structure may include an actuator (e.g., the actuator 60 in FIG. 6) configured to output power, based on a temperature detected inside the housing. The link structure may include a first link (e.g., the first link 61 in FIG. 6) configured to move in a first direction by the power. The link structure may include a second link (e.g., the second link 62 in FIG. 6). The second link may be configured to transmit the power in a second direction perpendicular to the first direction in response to a movement of the first link. The second link include an elastic structure including a first spring (e.g., the first spring 91 in FIG. 7) and a second spring (e.g., the second spring 92 in FIG. 7) each of the first and second springs having different elastic forces. The link structure may include a third link (e.g., the third link 63 in FIG. 6). The third link may be configured to connect the second link and the cover. The third link may be configured to transmit the power in a third direction perpendicular to the first direction and the second direction to switch the cover from a closed state to an open state using a scissor action. The second link may include a first support (e.g., the first support structure 81 in FIG. 8) disposed in the housing or integrally provided with the housing. The second link may include a second support (e.g., the second support structure 82 in FIG. 8) positioned in a first space part (e.g., the first space part 813 in FIG. 8) of the first support structure. The second support may be configured to be slidable in parallel to the second direction with respect to the first support. The second support may be connected to the third link. The second link may include a shaft (e.g., the shaft 70 in FIG. 8) positioned across a second space part (e.g., the second space part 823 in FIG. 8) of the second support. The shaft may be configured to extend from one end (e.g., the one end 71 in FIG. 8) corresponding to the first link to the other end (e.g., the other end 72 in FIG. 8) thereof. The shaft may be configured to be slidable in parallel to the second direction with respect to the second support. The first spring may be positioned in the first space part while being penetrated by the shaft. The first spring may be positioned between a first support part (e.g., the first support part 731 in FIG. 7) provided on a portion of the shaft and a side wall (e.g., the first side wall 801 in FIG. 7) of the first support, the portion being provided outside the second support, the side wall facing and being spaced apart from the first support part. The second spring may be positioned in the second space part while being penetrated by the shaft. The second spring may be positioned between a second space part (e.g., the second support part 732 in FIG. 7) provided on the shaft and a side wall (e.g., the fourth side 804 in FIG. 7) of the second support, which faces and is spaced apart from the second support part. The second spring (e.g., the second spring 92 in FIG. 11) may have an elastic force greater than an elastic force of the first spring (e.g., the first spring 91 in FIG. 11). Based on the first link (e.g., the first link 61 in FIG. 11) being moved in the first direction (e.g., the +x-axis direction in FIG. 11), the shaft (e.g., the shaft 70 in FIG. 11) may be configured to be moved in the second direction (e.g., the +y-axis direction in FIG. 11). Based on the shaft being moved in the second direction, the first spring may be configured to be compressed, and the second spring may be configured to not be compressed or be less compressed than the first spring.

According to an example embodiment of the disclosure, based on the shaft (e.g., the shaft 70 in FIG. 11) being moved in the second direction (e.g., the +y-axis direction in FIG. 11), the second support (e.g., the second support structure 82 in FIG. 11) may be configured to be moved in the second direction together with the shaft in a state of being supported by the second spring (e.g., the second spring 92 in FIG. 11). Based on the second support being moved in the second direction, the third link (e.g., the third link 63 in FIG. 13) may be configured to switch the cover (e.g., the cover 25 in FIG. 13) from the closed state to the open state.

According to an example embodiment of the disclosure, based on the cover (e.g., the cover 25 in FIG. 13) being forcibly switched from the open state to the closed state by an external force, the second support (e.g., the second support structure 82 in FIG. 14) connected to the third link (e.g., the third link 63 in FIG. 13) may be configured to be moved in a direction opposite to the second direction (e.g., the −y-axis direction in FIG. 14), to compress the second spring (e.g., the second spring 92 in FIG. 14).

According to an example embodiment of the disclosure, the link structure (e.g., the link structure 6 in FIG. 6) may include at least one hook (e.g., the first hook 641 or the second hook 642 in FIG. 14) configured to interfere with the second support (e.g., the second support structure 82 in FIG. 14) to prevent and/or inhibit the second support from being moved in the second direction (e.g., the +y-axis direction in FIG. 14) based on the cover being forcibly switched from the open state to the closed state.

According to an example embodiment of the disclosure, the housing may include a foldable housing (e.g., the foldable housing 21 in FIG. 2). Based on the foldable housing being switched from an unfolded state to a folded state, the cover (e.g., the cover 25 in FIG. 4) may be forcibly switched from the open state to the closed state.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a housing comprising an opening;
   a cover configured to open or close the opening; and
   a link structure positioned inside the housing and connected to the cover,
   wherein the link structure comprises:
   an actuator configured to output power based on a temperature detected inside the housing;
   a first link configured to move in a first direction by the power;
   a second link configured to transmit the power in a second direction perpendicular to the first direction in response to a movement of the first link and including an elastic structure comprising a first spring and a second spring, each of the first and second springs having different elastic forces; and
   a third link connected to the second link and the cover and configured to transmit the power in a third direction perpendicular to the first direction and the second direction to switch the cover from a closed state to an open state.

2. The electronic device of claim 1, wherein the second link comprises:
   a first support disposed in the housing or integrally provided with the housing;
   a second support positioned in a first space part of the first support, configured to be slidable in parallel to the second direction with respect to the first support, and connected to the third link; and
   a shaft positioned across a second space part of the second support, the shaft having one end corresponding to the first link and another end extending from the one end, and configured to be slidable in parallel to the second direction with respect to the second support,
   wherein the first spring is positioned in the first space part while being penetrated by the shaft and positioned between a first support part provided on a portion of the shaft and a side wall of the first support, the portion being provided outside the second support, the side wall facing and being spaced apart from the first support part, and
   wherein the second spring is positioned in the second space part while being penetrated by the shaft and positioned between a second support part provided on the shaft and a side wall of the second support, which faces and is spaced apart from the second support part.

3. The electronic device of claim 2, wherein the second spring has an elastic force greater than an elastic force of the first spring,
   wherein based on the first link being moved in the first direction, the shaft is configured to move in the second direction, and
   wherein based on the shaft being moved in the second direction, the first spring is compressed.

4. The electronic device of claim 2, wherein based on the shaft being moved in the second direction, the second support is configured to move in the second direction together with the shaft in a state of being supported by the second spring, and
   wherein based on the second support being moved in the second direction, the third link is configured to switch the cover from the closed state to the open state.

5. The electronic device of claim 4, wherein based on the cover being forcibly switched from the open state to the closed state by an external force, the second support connected to the third link is configured to move in a direction opposite to the second direction so that the second spring is compressed.

6. The electronic device of claim 5, wherein the link structure comprises at least one hook configured to interfere with the second support to prevent and/or inhibit the second support structure from being moved in the second direction based on the cover being forcibly switched from the open state to the closed state.

7. The electronic device of claim 5, wherein the housing comprises a foldable housing, and
   wherein based on the foldable housing being switched from an unfolded state to a folded state, the cover is configured to be forcibly switched from the open state to the closed state.

8. The electronic device of claim 7, wherein the electronic device comprises a laptop computer.

9. The electronic device of claim 2, wherein one end of the shaft comprises a second inclined part configured to rub against a first inclined part of the first link.

10. The electronic device of claim 1, wherein the third link is configured to fold in a scissor action.

11. The electronic device of claim 1, wherein the actuator is configured to output power based on a temperature detected inside the housing being greater than or equal to a threshold value.

12. The electronic device of claim 1, wherein the actuator comprises at least one bimetal configured to be displaced in the first direction in reaction to heat having a specified temperature or more.

13. The electronic device of claim 1, wherein the actuator comprises a motor controlled by at least one processor included in the electronic device.

14. The electronic device of claim 1, wherein the actuator comprises a solenoid controlled by at least one processor included in the electronic device.

15. The electronic device of claim 1, wherein the opening comprises an air suction hole.

\* \* \* \* \*